US012743570B2

(12) United States Patent
Nath et al.

(10) Patent No.: US 12,743,570 B2
(45) Date of Patent: Sep. 22, 2026

(54) GENERATIVE SELF-SUPERVISED LEARNING TO TRANSFORM CIRCUIT NETLISTS

(71) Applicant: NVIDIA Corp., Santa Clara, CA (US)

(72) Inventors: Siddhartha Nath, San Jose, CA (US); Haoxing Ren, Austin, TX (US); Geraldo Pradipta, Minneapolis, MN (US); Corey Hu, San Diego, CA (US); Tian Yang, Los Altos, CA (US)

(73) Assignee: NVIDIA Corp., Santa Clara, CA (US)

( * ) Notice: Subject to any disclaimer, the term of this patent is extended or adjusted under 35 U.S.C. 154(b) by 1154 days.

(21) Appl. No.: 17/826,881

(22) Filed: May 27, 2022

(65) Prior Publication Data

US 2023/0334215 A1 Oct. 19, 2023

Related U.S. Application Data

(60) Provisional application No. 63/331,566, filed on Apr. 15, 2022.

(51) Int. Cl.

| | |
|---|---|
| ***G06F 30/392*** | (2020.01) |
| ***G06F 18/21*** | (2023.01) |
| ***G06F 30/394*** | (2020.01) |
| ***G06N 20/00*** | (2019.01) |

(52) U.S. Cl.

CPC ........ *G06F 30/392* (2020.01); *G06F 18/2185* (2023.01); *G06F 30/394* (2020.01); *G06N 20/00* (2019.01)

(58) Field of Classification Search

CPC .. G06F 30/392; G06F 18/2185; G06F 30/394; G06F 2119/12; G06N 20/00; G06N 3/0455; G06N 3/063; G06N 3/08

See application file for complete search history.

(56) References Cited

U.S. PATENT DOCUMENTS

| | | | | |
|---|---|---|---|---|
| 10,867,091 | B1 * | 12/2020 | Oh | G06F 30/331 |
| 10,970,441 | B1 * | 4/2021 | Zhang | G06N 3/082 |
| 11,556,690 | B2 * | 1/2023 | Goldie | G06N 3/0455 |
| 2019/0228126 | A1 * | 7/2019 | Oh | G06F 30/3312 |
| 2019/0354796 | A1 * | 11/2019 | Meshi | G06N 3/049 |
| 2019/0385047 | A1 * | 12/2019 | Lei | G06N 3/10 |
| 2020/0274554 | A1 * | 8/2020 | Aspuru-Guzik | G06N 10/20 |
| 2021/0117603 | A1 * | 4/2021 | Jiang | G06N 3/08 |
| 2022/0318684 | A1 * | 10/2022 | Allahdadian | G06N 3/0495 |

OTHER PUBLICATIONS

"Pre-Routing Path Delay Estimation Based on Transformer and Residual Framework", Tai Yang, Guoqing He, Peng Cao, Feb. 21, 2022, IEEE.*

"Attention is All You Need", 31st Conference on Neural Information Processing Systems (NIPS 2017), Long Beach, CA, USA.*

(Continued)

*Primary Examiner* — Nha T Nguyen

(74) *Attorney, Agent, or Firm* — Carnelian Law, LLC

(57) ABSTRACT

Self-supervised machine learning is applied to combinational gate sizing based on an input circuit netlist. A transformer neural network architecture is disclosed to select gate sizes along paths of the network between primary inputs/outputs and/or sequential logic elements. The gate size selections may be optimized along dimensions such as path delay, path power consumption, and path circuit area.

20 Claims, 15 Drawing Sheets

(56) References Cited

OTHER PUBLICATIONS

A. B. Kahng, S. Kang et al., "Learning-based approximation of interconnect delay and slew in signoff timing tools," in 2013 ACM/IEEE International Workshop on System Level Interconnect Prediction (SLIP). IEEE, 2013, pp. 1-8.

A. Sharma, D. Chinnery et al., "Fast lagrangian relaxation-based multithreaded gate sizing using simple timing calibrations," IEEE Transactions on Computer-Aided Design of Integrated Circuits and Systems, vol. 39, No. 7, pp. 1456-1469, 2019.

A. Vaswani, N. Shazeer et al., "Attention is all you need," in Advances in Neural Information Processing Systems, I. Guyon, U. V. Luxburg et al., Eds., vol. 30. Curran Associates, Inc., 2017.

C.-P. Chen, C. Chu, and D. Wong, "Fast and exact simultaneous gate and wire sizing by lagrangian relaxation," IEEE Transactions on Computer-Aided Design of Integrated Circuits and Systems, vol. 18, No. 7, pp. 1014-1025, 1999.

H. Wang, K. Wang et al., "Gcn-rl circuit designer: Transferable transistor sizing with graph neural networks and reinforcement learning," in 2020 57th ACM/IEEE Design Automation Conference (DAC). IEEE, 2020, pp. 1-6.

S. Roy, D. Liu et al., "OSFA: A new paradigm of gate-sizing for power/performance optimizations under multiple operating conditions," in 2015 52nd ACM/EDAC/IEEEDesign Automation Conference (DAC), 2015, pp. 1-6.

Y.-C. Lu, S. Nath et al., "RI-sizer: Vlsi gate sizing for timing optimization using deep reinforcement learning," in 2021 58th ACM/IEEE Design Automation Conference (DAC). IEEE, 2021, pp. 733-738.

* cited by examiner

GENERATIVE SELF-SUPERVISED LEARNING TO TRANSFORM CIRCUIT NETLISTS

CROSS REFERENCE TO RELATED APPLICATIONS

This application claims priority and benefit under 35 U.S.C. 119 to U.S. Application No. 63/331,566, titled "CIRCUIT GATE SIZING USING A SEQUENCE-GENERATIVE TRANSFORMER", filed on Apr. 15, 2022, the contents of which are incorporated herein by reference in their entirety.

BACKGROUND

Modern Electronic Design Automation (EDA) digital implementation tools utilize various netlist optimization techniques. For example, gate (or, cell or instance) sizing is one of the basic netlist optimization techniques. Gate sizing is used in stages from synthesis to postroute optimization, and thereafter in procedures for performance, power and area (PPA) optimization. Gate sizing may be determined utilizing an optimal (mixed) integer linear programming formulation and solver. However, modern designs with ≥1.5M instances along with multi-corner multi-mode (MCMM) constraints may render such a formulation impossible to solve in linear time.

Practitioners have attempted relaxation techniques such as Lagrangian relaxation and various other heuristics to perform gate sizing in more or less linear time. Modern EDA tools also make use of thread-level parallelism by sizing many instances in parallel having local graphs (or, subgraphs) that do not intersect (i.e., have no common instance pins). These heuristics may "stick" in a local optima of PPA even though they execute in linear time. More often, sub-linear runtimes result when optimization is performed in the inner loop of another algorithm such as physical synthesis. Existing sizing algorithms are too slow to incorporate in such inner loops and this limits early-stage exploration of logic optimization, floor planning, and placement, for example.

Previous solutions attempt either algorithmic sizing based on various heuristics to achieve close to linear runtime (with respect to the number of sizable gates/instances), or use machine learning (such as reinforcement learning) to perform exploitation and exploration. For example, some conventional approaches utilize a heuristic to select gates to size based on the most critical path in the design. While reinforced learning facilitates reaching a global minimum of design's total negative slack, the heuristic to pick gates in some order is suboptimal. Some conventional approaches also rely on a pre-trained target value network.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 1 depicts a circuit path comprising a synchronous circuit 102 starting point, a synchronous circuit 104 ending point, and a sequence of combinatorial circuits 106 (buffers in this example) in between.

DETAILED DESCRIPTION

Figure 1:
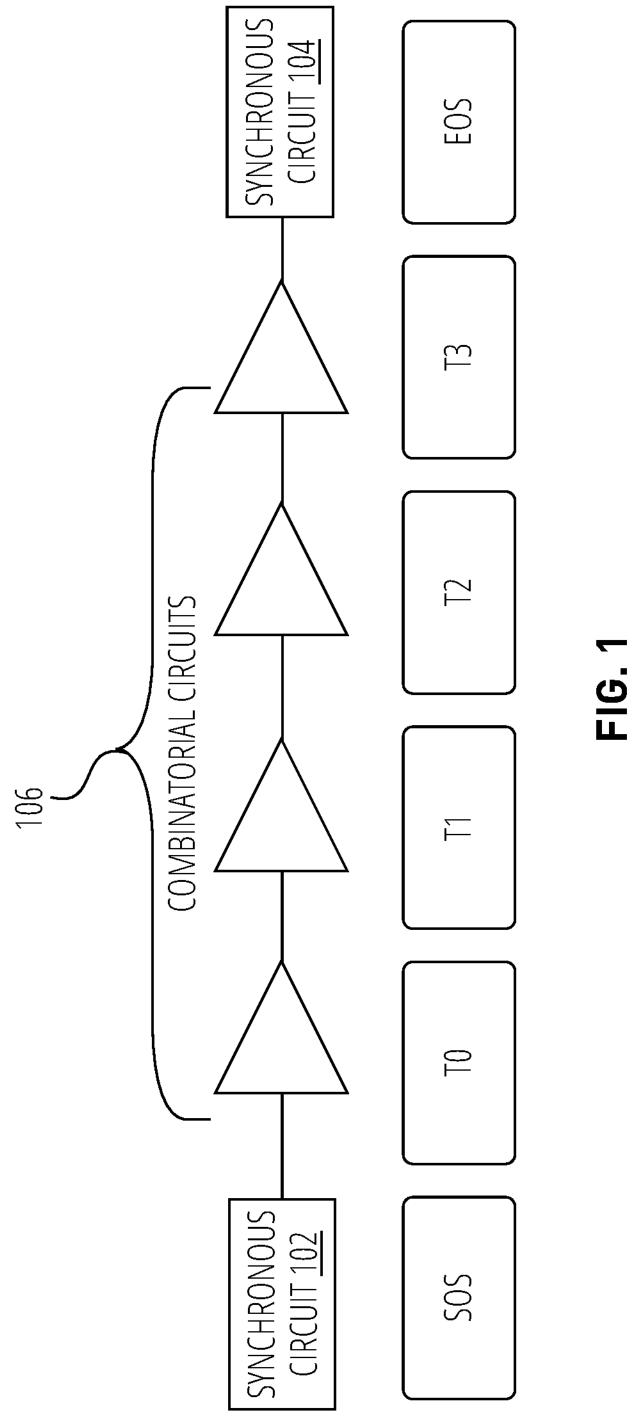

To alleviate runtime and local optima limitations of conventional approaches, embodiments of a timing path generation mechanism are disclosed to transform a circuit netlist using a trained transformer model. In the exemplary embodiments, a transformer model is trained such that gate size distributions in a technology library are well-represented. The model is technology-specific and may be trained and implemented for different technology nodes (circuit fabrication/density processes) and/or when new libraries are introduced for a particular technology. The exemplary embodiments utilize a generative modeling structure comprising transformer networks that select and set sizing of the gates used in integrated circuits.

Herein the term 'gate' is used to refer to a logic gate in a circuit. Combinatorial gates, which transform one or more inputs into one or more outputs independently of a trigger/clock signal, are distinguished from synchronous circuit elements, which operate on a clock/trigger signal or signals.

The disclosed mechanisms are not constrained by ordering or critical path dependence and operate on critical as well as sub-critical circuit paths. Gate sizing is carried out for a combinatorial gate sequence in a netlist, forward from start point to endpoint, and/or backward from endpoint to start point. No additional system pre-configuration (prior to operation) need be utilized beyond the training of the transformer's encoders and decoders. The system may select gates that optimize timing, power, area, or combinations thereof in circuit paths, based on an 'effort-level' setting provided in the decoder. Herein, 'optimize' does not mean meeting a theoretical optimal value, but should be understood as meaning the setting of values that best provide some particular characteristic of a circuit within constraints and precision of the implementation and technology utilized.

The exemplary embodiments utilize a machine learning-based gate sizing framework that automatically generates gate sizes on each timing path either to minimize timing (i.e., delay), power, area, or combinations thereof. A dual encoder-decoder transformer architecture mimics electrical signal propagation characteristics such as transition, arrival, required, and capacitance. The system is conditioned for timing versus power/area tradeoffs by applying an 'effort level' as a start-of-sequence token in the decoder. A novel weighted cross-entropy loss function may be utilized employing the normalized mean square error (MSE) of FO4 delay values of the gates as the weight.

The exemplary embodiments may operate on netlists that are unoptimized (e.g., a netlist after logic synthesis or an IP block generated in a gate level netlist) or only partially optimized (e.g., a netlist after global placement and optimization by a commercial tool). The exemplary embodiments enable fast iterations of physical synthesis and optimization and provide rapid feedback to early circuit design stages. The exemplary embodiments may be adapted to work across different technology nodes, IP blocks, and design styles.

In one aspect, a transformer network for setting the characteristics of gates in a circuit is trained with gate characteristic distributions from a technology library (also called 'standard cell library' in the art). The transformer network includes an encoder and a decoder, each typically having multiple encoding and decoding stages, respectively. The transformer network transforms a combinatorial gate sequence to improve one or more operational characteristics of the circuit based on an effort level setting applied to the decoder.

The effort level setting may be implemented as a ratio of a median delay and an actual delay for the gate sequence. The transformer network may also utilize a weighted cross-entropy loss function employing, as a weight value, a normalized mean square error (MSE) of FO4 delay values of the gates in the gate sequence.

The predicted sizes of gates may optimize timing, power, area, or combinations thereof for the gate sequence.

In another aspect, a system includes at least one processor and at least one memory. The memory implements logic to operate a transformer network encoder to transform a sequence of gate types for a combinatorial circuit path into encoder outputs, apply the first outputs to a decoder of the transformer network, further apply to the decoder a token sequence including an effort level, the sequence of gate types, and predicted sizes for gates of the combinatorial circuit path, and to operate the decoder to generate a sequence of gate sizes for the combinatorial circuit path from the gate types, effort level, encoder outputs, and predicted gate sizes.

Other technical features may be readily apparent to one skilled in the art from the following figures, descriptions, and claims.

FIG. 1 depicts a circuit path comprising a synchronous circuit 102 starting point, a synchronous circuit 104 ending point, and a sequence of combinatorial circuits 106 (buffers in this example) in between. For each such path modeled as a sequence in a netlist, the transformer generates accurate sizes of for the gates (logic cells) at each position in the sequence. A netlist primary input (PI) or a sequential logic element's clock pin is treated as the "start of sequence" (SOS) token, and a timing endpoint such as a primary output (PO) or a sequential logic element's D-pin is treated as the "end of sequence" (EOS) token. In general, any constrained input pins of a sequential logic gate, such as a flip-flop or latch, are potential start points. These may include scan pins as well as inputs of multi-bit flops. Likewise, endpoints may be any such constrained pin. Combinational gates (buffers, inverters, Boolean logic cells, etc.) in the path are represented by tokens (e.g., T0, T1, . . . , T3) that are input to the encoder component of the transformer network.

At a high level, transformer neural network structures comprise an encoder and a decoder and connections between these components. A transformer network receives an input sequence (x1, x2, . . . , xn) and maps it to an output sequence of (z1, z2, . . . , zn). An encoding component may comprise a stack of multiple encoding stages and a decoding component may comprise a stack of multiple decoding stages, typically of the same number as there are encoding stages. The encoding stages ("encoders" for short) are neural networks and typically may be identical in structure to one another, except they may acquire differences in their internal settings during training (e.g., be trained to have different weights from one another). Likewise the decoding stages ("decoders" for short) may typically all have the same structure except for differences acquired in training. The encoders and decoders may comprise "layers" that perform operations on vector inputs to generate vector or scalar outputs. These vectors may be multidimensional (generally NxMx . . . P, N,M, . . . P≥1) and nested, and are commonly referred to as tensors.

Figure 2:
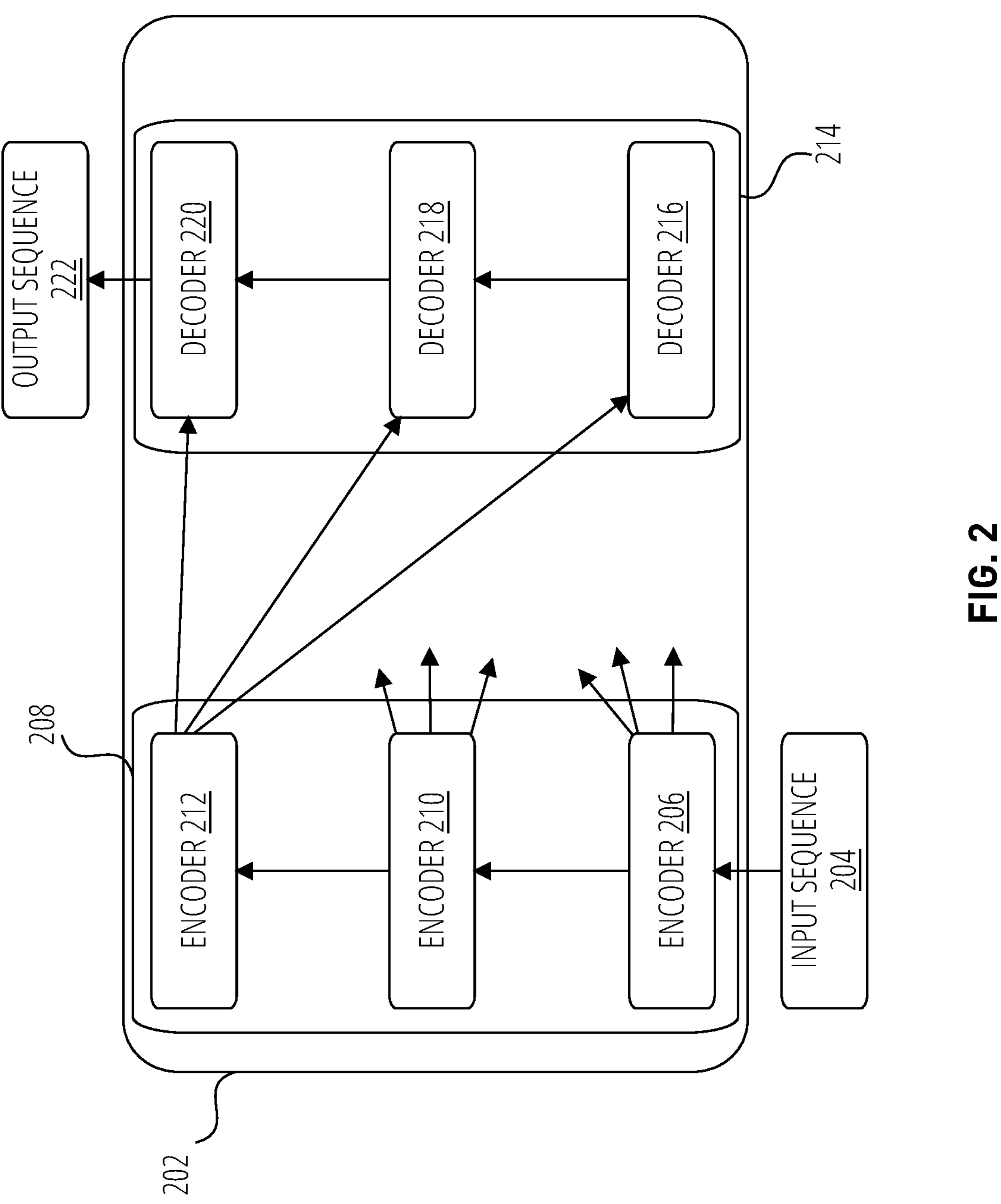
FIG. 2 depicts a transformer neural network 202 in accordance with one embodiment.

FIG. 2 depicts a transformer neural network 202 in one embodiment. The transformer neural network 202 receives an input sequence 204 at a first encoder 206 of an encoder stack 208. The encoder 206 performs an encoding on the input sequence 204 and passes results to the encoder 210, which performs additional encoding and passes results to encoder 212. Although three encoders are depicted in the encoder stack 208, there may be any manageable number in practice.

Results of the last encoder 212 in the encoder stack 208 are provided to the decoder stack 214. The decoder stack 214 as depicted comprises three decoders (decoder 216, decoder 218, and decoder 220) but in practice there may be any manageable number. The encoding results of the final encoder 212 are provided to the first decoder 216 of the decoder stack 214, and the attention results of the final encoder 212 may be fully connected with the encoder-decoder attention layers 404 of each encoder in the decoder stack 214, in one embodiment. The decoder stack 214 operates on the results provided by the encoder stack 208 to generate an output sequence 222 transformation of the input sequence 204. There may typically be linear and Softmax layers (not depicted) at the output of the final decoder 220 stage to produce the output sequence 222.

Generally, attention vectors from any encoder self-attention layer may be provided to any decoder encoder-decoder attention layer. Also the attention layers may be "multi-headed" as known in the art.

An encoder stage block may comprise of two sub-layers, a multi-head self-attention layer and a position-wise feed-forward network (FFN). A residual coupling is employed between the two sublayers, followed by layer normalization. A decoder stage has similar structure, but further comprises a multi-head encoder-decoder attention layer. This additional self-attention layer in the decoder stack comprises modifications to prevent each position from attending to subsequent positions.

Figure 3:
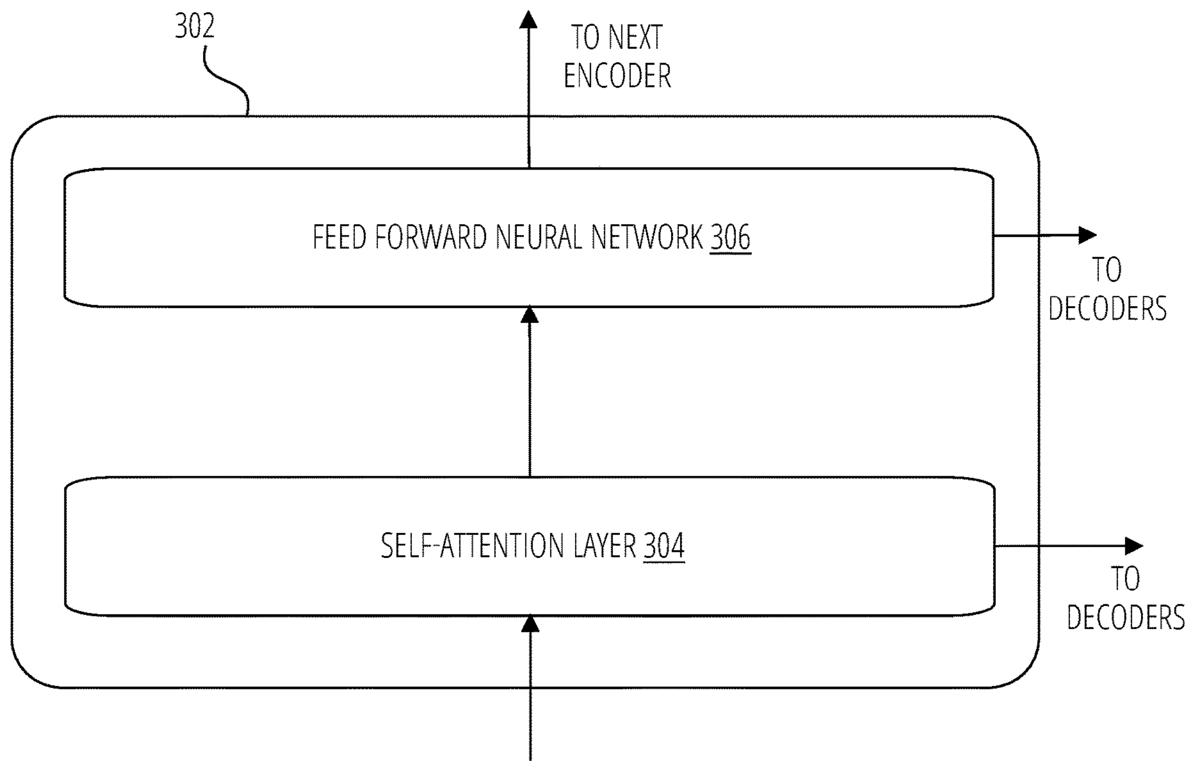
FIG. 3 depicts an encoder 302 in accordance with one embodiment.

FIG. 3 depict an encoder 302 in one embodiment. The encoder 302 receives input vectors at a self-attention layer 304, which transforms the input vectors before passing them to a feed forward neural network 306. Results of the feed forward neural network 306 are passed to a next encoder stage (if there is one), and/or to decoders if the encoder 302 is a final encoder stage. Depending on the implementation, results of the self-attention layer 304 may also be passed to one or more decoder stages (e.g., if the encoder 302 is a final encoder stage). There may typically be summation and normalization layers (not depicted) following each of the self-attention layer 304 and feed forward neural network 306.

Figure 4:
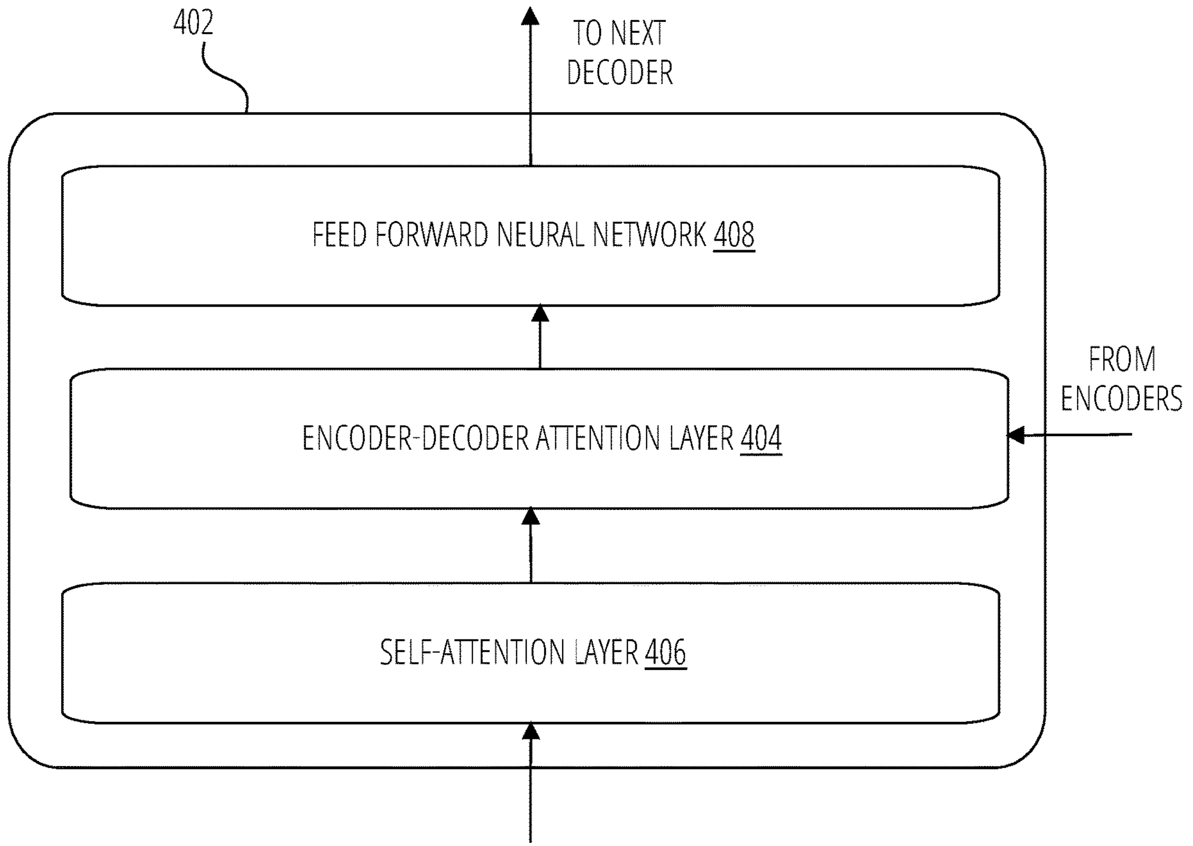
FIG. 4 depicts a decoder 402 in accordance with one embodiment.

FIG. 4 depict a decoder 402 in one embodiment. The decoder 402 receives inputs (from previous decoder stages or from encoder stages) at a self-attention layer 406. Results of the self-attention layer 406 are passed to an encoder-decoder attention layer 404, which may also receive attention inputs from one or more self-attention layers 304 of the encoder stack 208. The encoder-decoder attention layer 404 helps the decoder 402 focus on more relevant parts of the input sequence at particular locations in the input sequence (similar what attention does in seq2seq models). The encoder-decoder attention layer 404 is followed by a feed forward neural network 408. There may typically be summation and normalization layers (not depicted) following each of the self-attention layer 406, encoder-decoder attention layer 404, and feed forward neural network 408.

Results of the encoder-decoder attention layer 404 are passed to a feed forward neural network 408 that generates outputs to a next decoder stage or final output results (possibly after additional processing by linear and Softmax layers).

Figure 5:
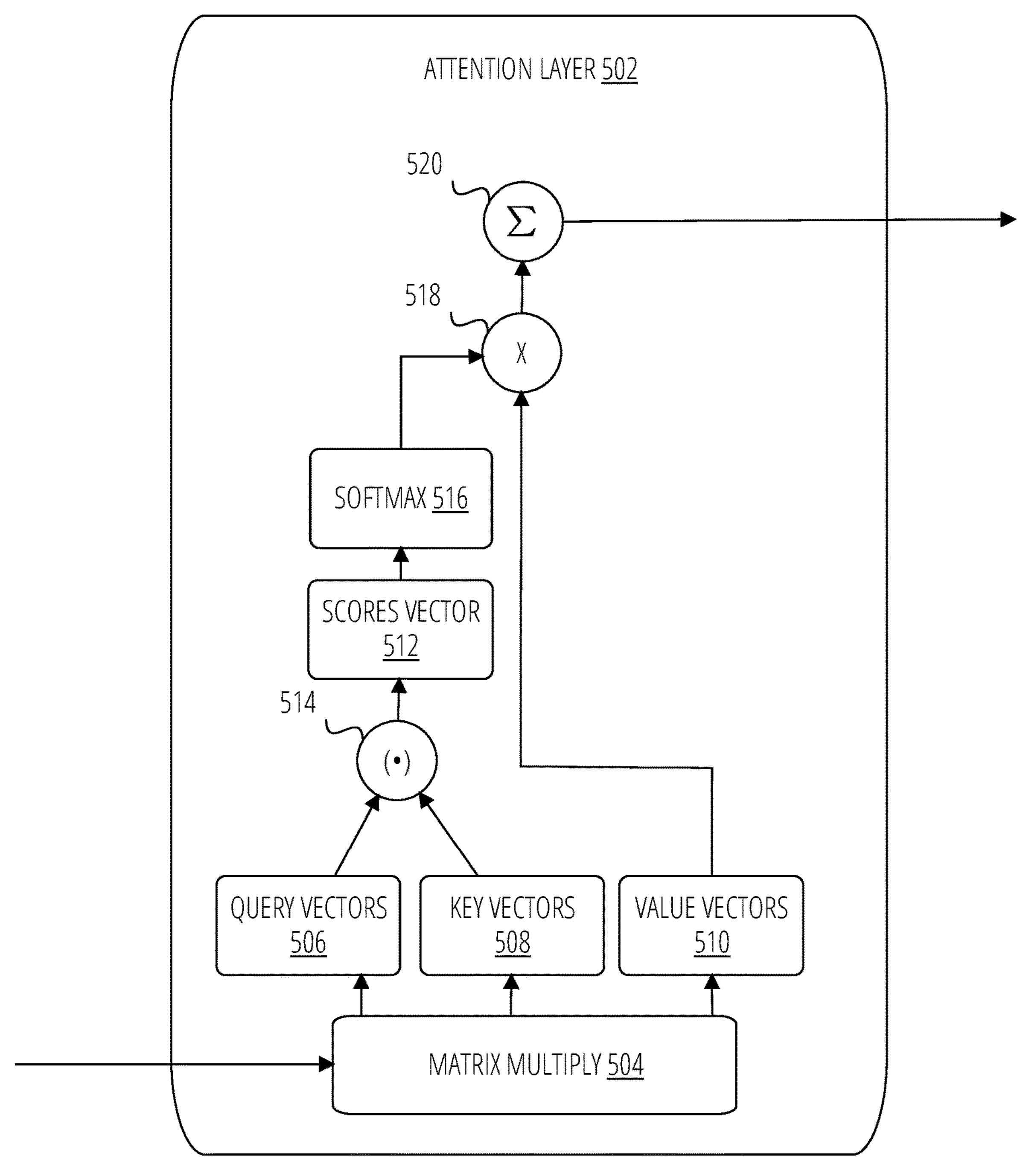
FIG. 5 depicts an attention layer 502 in accordance with one embodiment.

FIG. 5 depicts an attention layer 502 in one embodiment. A matrix multiply 504 is performed on the input vectors to the attention layer 502 to form query vectors 506, key vectors 508, and value vectors 510. The matrices applied in the matrix multiply 504 are derived by training the neural network comprising the attention layer 502.

Next a scores vector 512 is derived by performing a dot product 514 of the query vectors 506 and key vectors 508. The element values in the scores vector 512 determine how much focus to place on other parts (e.g., tokens) of the input vector while processing a particular token of the input vector. The scores vector 512 is then processed with a Softmax 516 algorithm to normalize the scores so they're all positive and add up to 1. The Softmax scores determine how much each token of the input sequence is expressed at the particular input sequence token position.

A multiply 518 is then performed on value vectors 510 by the Softmax score and the weighted value vectors 510 are summed up (vector summation 520).

Figure 6:
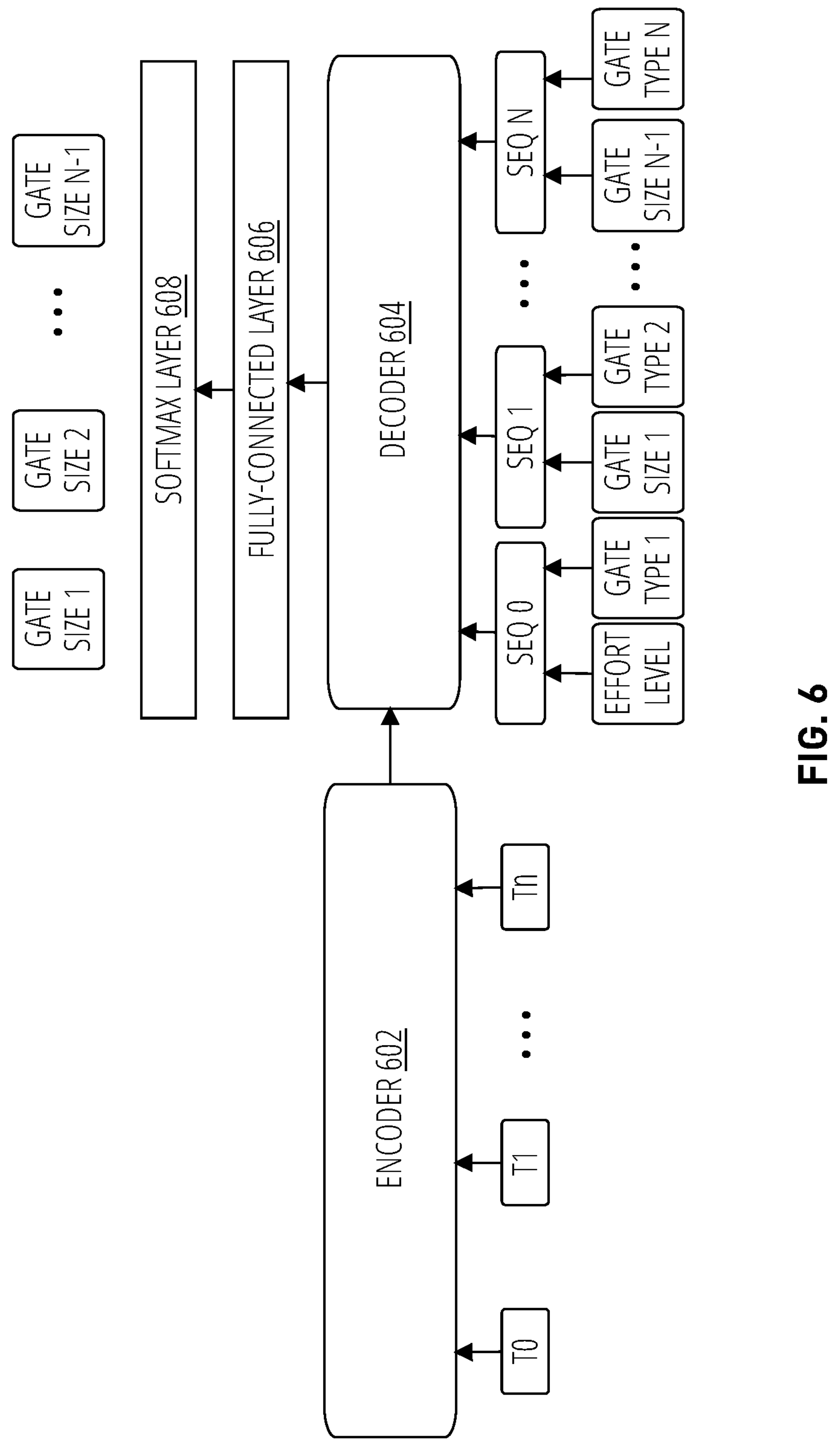
FIG. 6 is a high-level depiction of an embodiment of a transformer network.

FIG. 6 is a high-level depiction of an embodiment of a transformer network. At a high-level, the transformer comprises an encoder 602, a decoder 604, and final stages including a fully-connected layer 606 and a Softmax layer 608.

The tensor input by the decoder 604 comprises two tokens (not depicted in FIG. 6) to denote the start and end of a path (sequence). These tokens represent a timing start point, such as a primary input or sequential logic clock pin, with a "start of sequence" (SOS) token. A timing endpoint, such as a primary or sequential logic's D pin, is denoted with an "end of sequence" token (EOS). The transformer operates to generate gate sizes in sequence order, from SOS to EOS.

Specific token types may be utilized to represent combinational elements in a path. The use of these token types may increase the efficiency and/or accuracy of the encoder. For example:

a. Pin coordinates: The (x, y) coordinates of the output pin(s) of each element may be used as a 'layout token' to distinguish placement of elements that comprise the same gate type. The pin coordinates may also inform the encoder that the same gate element belongs to multiple paths, so that the embeddings created for the same element used in multiple paths differ only in respect to the different path characteristics.

b. Pin-to-pin distance: The Manhattan distance between the source and sink pins of a net arc on the timing path may be computed to differentiate stages of a same path to be differentiated from one another. This may also enable differentiation of multiple paths to the same or a different endpoint. Pin-to-pin distance is another example of a 'layout token'.

c. Net's half-perimeter wirelength (HPWL): Nets in a timing path may comprise multiple fanouts. The HPWL layout token enables the encoder to differentiate nets having the same fanouts but having different values of HPWL in each timing path. This token augments the pin-to-pin distance token for more accurate differentiation of timing paths.

d. Net's wire capacitance: This is an example of a 'timing token' that distinguishing the routing topology of a net in a timing path. During training, this token may be obtained at the post-route stage. For example, a commercial tool may identify this token from a detailed routing topology. During inference (or, testing), this token may be obtained from pre-route extraction from a net topology based on Manhattan-like routes or Steiner routes.

e. Pin-to-pin arc delay: This timing token distinguishes net delays in timing paths and augments the net's wire capacitance token. In case multiple arc delays exist based on polarity (e.g., rise-to-rise or fall-to-fall), the worst arc delay may be used.

f. Net's fanouts: This 'logic token' differentiates each net's logical topology on each timing path. This token along with others is an indication of a strength of the net's driving capability, and by extension its size.

g. Number of reachable endpoints: This logic and timing token indicates the criticality of a gate in a timing path. When a gate has large number of reachable endpoints in its transitive fanout cone, it is typically more critical than another gate with fewer number of reachable endpoints.

h. Gate type: This 'library token' guides the gate sizes selected by the model. Some sizes may not exist in standard libraries for certain gate types. Based on the distribution of gate sizes for different gate types in the training set, this token enables selecting the appropriate sizes for each gate type.

i. Number of available library references: This library token characterizes the variety of sizes that may exist in the library for each gate type. It also indicates what the distribution of sizes per gate type should be in the training set so that the transformer network can learn the available sizes.

Table I below provides example tokens used by an encoder in one embodiment. Table I is an exemplary list, not an exhaustive list. Tokens other than those listed in Table I may be utilized depending upon the implementation. The encoder tensor elements may comprise the gate type and related layout, timing, logic, and library tokens, arranged sequentially from start point to endpoint in the paths of a netlist.

TABLE I

| Token Name | Token Type | Symbol |
|---|---|---|
| Output pin coordinates | Layout | $Pin_{x,\,y}$ |
| Pin-to-pin distance | Layout | P2PDist |
| Net's HPWL | Layout | $Net_{HPWL}$ |
| Net's wire capacitance | Timing | $Net_{cap}$ |

TABLE I-continued

| Token Name | Token Type | Symbol |
|---|---|---|
| Pin-to-pin arc delay | Timing | $Net_{delay}$ |
| Number of reachable endpoints | Timing, Logic | NREp |
| Gate type | Library | GType |
| Number of library references | Library | NLRef |
| Fanout-of-Four Delay (FO4) | Layout | FO4Delay |

The encoder in one embodiment is provided a set of token types for each gate. These may include the gate type (GType in Table 1, e.g., BUFF, INV, NR2, HA, XOR, MUX, etc.); median, minimum and maximum fanout-of-four delay (FO4Delay); number of equivalent references in the libraries (NLRef); the half-perimeter wirelength ($Net_{HPWL}$) of the net it is driving (to model the impact of net delay); number of fanouts; number of reachable endpoints (NREp); and coordinates of the output pin of the gate ($Pin_{x,y}$). In addition, the scenario name and clock periods may be provided as tokens for each sequence to the encoder.

The FO4 delay of a gate for a particular gate size is the delay of the gate when it drives four identical gates of the same size (four same-sized sink gates).

The sequence provided as input to the decoder is modified to enable control of timing versus power constraints and area tradeoffs on each path. This enables the transformer network to finely control the PPA tradeoffs at a path-level. In one embodiment an "effort-level" metric is formulated and applied to the decoder, as follows:

$$\text{effort level} = \frac{\text{median path delay}}{\text{actual path delay}}$$

wherein the actual path delay is calculated as a difference between arrival times of a signal at the start point and at the endpoint. When the netlist is fully unoptimized, the arrival time at the endpoint may not be meaningful, in which case the clock period value may be used as the actual path delay. The median path delay may be formulated as a sum of the median fanout-of-four (FO4) delay of each gate type in the timing path. For example, the median path delay of the path in FIG. 7 will be the sum of twice the median F04 delay of the BUFF gate (which appears twice in the sequence) and the median FO4 delays of the AND, NAND, and OR gates, which each appear once. To improve performance, a one-time computation may be performed and recorded for the FO4 delays and the median FO4 delay for each gate type and size in the timing libraries for a given technology node. For each gate function ID in the timing libraries, one median FO4 delay is computed and stored. Thereafter, a lookup and reuse these values may be performed for each netlist implemented using particular libraries.

The effort-level metric enables trading off timing optimization for power and/or area optimization. When the effort-level is <1, it is an indication that the path has a timing violation and would benefit from gate sizes greater than the size closest to the median FO4 delay. When the value is =1, it is an indication that the size closest to the median size can close timing on the path. When the value is >1, it is an indication that the path is not timing-critical and may benefit from smaller sizes for improved power consumption and area characteristics.

The start token to the decoder comprises the effort-level and the first gate type. Thereafter, the sequence comprises tuples of <embedding of the predicted $k^{th}$ gate size, $(k+1)^{th}$ gate type>, until the sequence endpoint is reached. To enhance usability of the decoder output, the size for each gate in a path may be output directly (not encoded or in need of further processing). This simplification enables downstream circuit design tools and engineers to apply the decoder outputs without additional post-processing.

The number of stages or path length may be calculated from the sequence and may be understood as analogous to the number of words in a sentence. Self-attention computes attention weight, that is, the relative importance of one element in the path to the other elements in the path in the context of some dimension along which to evaluate.

Figure 7:
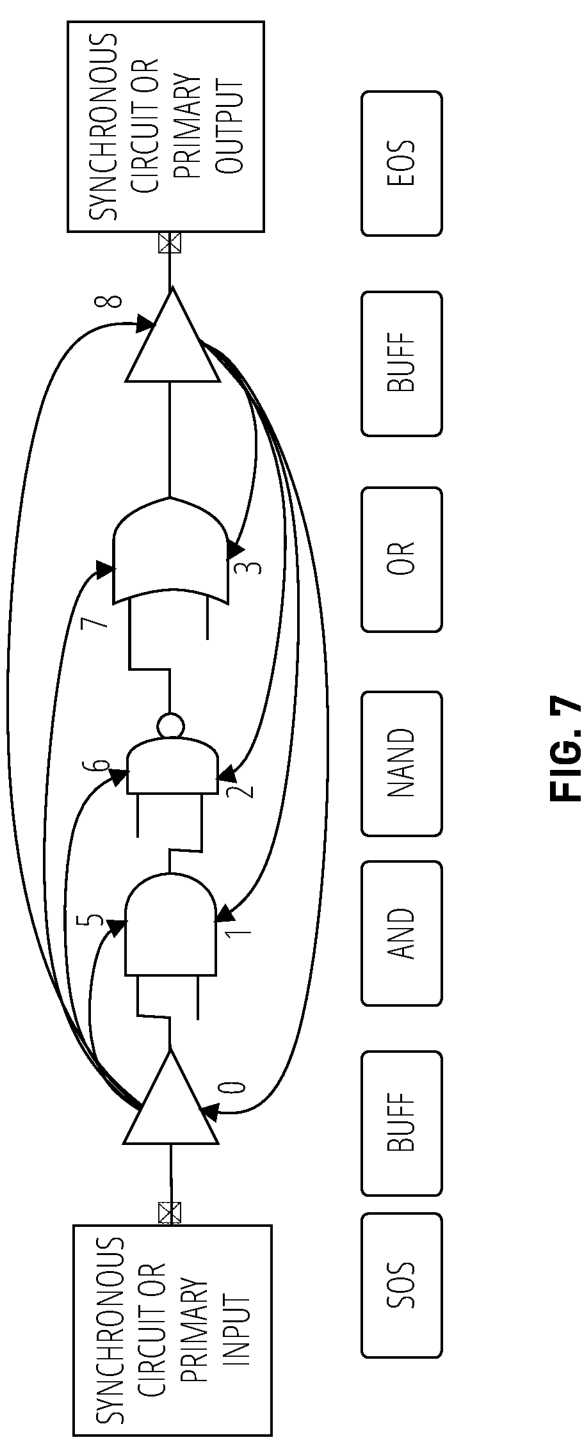
FIG. 7 depicts a relative position representation of a gate sequence.

To compute the attention weights, the distance between two elements may be represented by the relative position representation (RPR) value as for example in FIG. 7, which depicts a path with five combinational instances that are represented in the sequence by their tokens. Omitting other possibly present tokens (such as those from Table I) to simplify the explanation, the sequence to the encoder in may be represented as follows by GType tokens: SOS→BUFF→AND→NAND→OR→BUFF→EOS. For a sequence of five combinational gate instances (excluding the SOS and EOS tokens), the number of learned embeddings to compute the attention weights is nine—one for the element itself, four embeddings for the four elements to its left in the order, and four embeddings for the four elements to its right in the order.

The values to the right of the arrows in FIG. 7 are the RPRs for the two BUFF elements in the path. For example, to compute attention weights between the BUFF elements after the start point and the NAND instance, the self-attention mechanism may utilize the sixth RPR; and to compute the weight with the last BUFF instance before the endpoint, it may utilize the eighth RPR.

However, to compute the weight between the last and first BUFF instances in this path, the information contained in the zeroth RPR is used. This is because the positional embedding of the same gate type in a path have different impact on attention weight computation, and RPR assists with disambiguation.

Although unnecessarily detailed for the description of the various embodiments, details of exact calculations using RPR indices are known in the art and may be found for example in P. Shaw, J. Uszkoreit, and A. Vaswani, "Self-attention with relative position representations," North American Chapter of the Association for Computational Linguistics, 2018, pp. 1-5.

Figure 8:
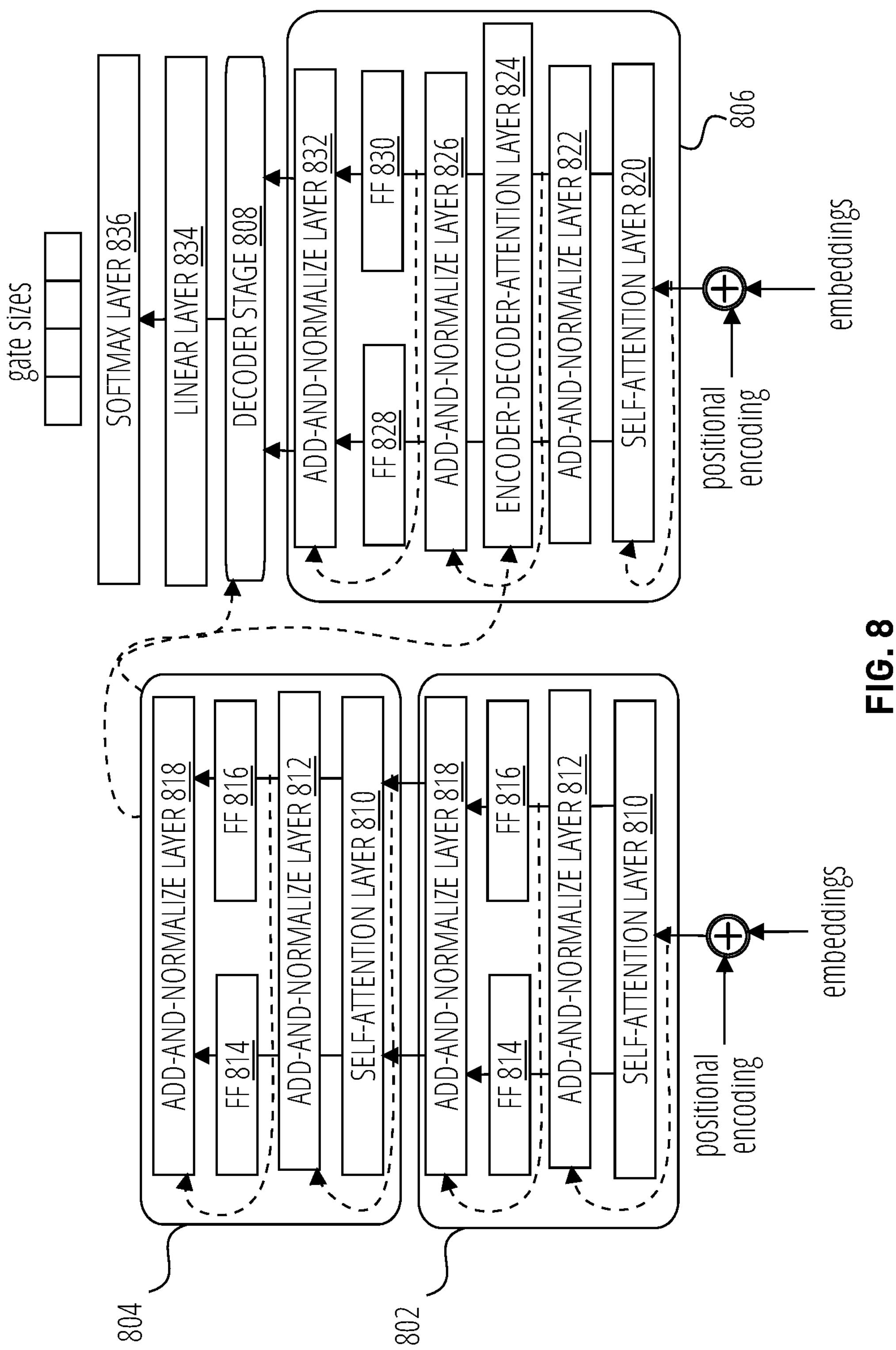
FIG. 8 depicts a transformer neural network in accordance with one embodiment.

FIG. 8 depicts a transformer network in one embodiment. The transformer comprises a plurality of encoders (two in the depiction, encoder stage 802 and encoder stage 804—generally there may be more encoder stages) and a corresponding number of decoders (decoder stage 806 and decoder stage 808). Each encoder comprises a self-attention layer 810, followed by an add-and-normalize layer 812, feed-forward layers 814, 816, and an add-and-normalize layer 818. Each decoder stage comprises a self-attention layer 820, followed by an add-and-normalize layer 822, an encoder-decoder-attention layer 824, an add-and-normalize layer 826, a plurality of feed-forward layers 828, 830, and an add-and-normalize layer 832. Outputs of the decoder stages are processed through a linear layer 834 and Softmax layer 836.

The transformer network may utilize an attention mechanism that applies query-key-value (QKV) vectors. The QKV vectors are used to determine a metric of similarity (attention score) between different positions of a single sequence in order to compute a representation of the sequence with a scaled dot-product:

$$\text{Attention}(Q, K, V) = Softmax\left(\frac{QK^T}{\sqrt{d_k}}\right)V$$

where $d_k$ is the dimension of the query and key vectors, $K^T$ is the transpose matrix of the original row-major key matrix, Q is the query matrix, and V is the value matrix The various feed-forward layers 814, 816, 828, 830, etc. may be fully connected feed-forward layers that operate separately and identically on each position output from the preceding layer:

$$FFN(x)=\text{ReLU}(xW^1+b^1)W^2+b^2$$

where x represents positional outputs of the preceding layer (feature matrix), W represents weight values, and b represents bias values. The superscripts are indices for the two different feed-forward layers, not exponents. The input and output dimension of trainable parameters $W^1$ and $W^2$ will typically vary between the feed-forward layers.

The transformer network model may be trained on post-route gate size settings (e.g., exclusively in some cases). The gate sizes at the post-route stage may be assumed to be the most practically optimal sizes realized by a commercial post-route tool. A Softmax score may be assigned to each available gate size from the set available in standard-cell libraries. Each gate size may be treated a separate class, defining a multi-class classification problem. Cross-entropy (CE) is one loss function with utility to a variety of classification tasks, and for an observation i may be computed as follows:

$$CE\ \text{Loss} = -\sum_{c=1}^{L} y_{i,c} \cdot \log(q_{i,c})$$

where L is the number of classes or gate sizes, $y_{i,c}$ is the binary indicator if class c is the correct classification for observation i, and $q_{i,c}$ is the predicted probability for the same observation i.

A deficiency of this loss function algorithm is that for every incorrectly-predicted gate size the loss value is the same, so that the model treats a size very close to the actual size, as well as a size very different (in delay) from the actual size, in the same manner. For example, consider sizes $s_0$, $s_1$, . . . , $s_M$ for a gate type ordered by FO4 delay value, and let $s_k$ be the actual size. When the model predicts size $s_{k+1}$, the CE loss is the same as prediction so even though the difference in FO4 delay between $s_k$ and $s_{k+1}$ is much smaller than it is between $s_k$ and $s_0$.

To remedy this deficiency, the pre-characterized FO4 delays of all gate sizes may be brought to bear. The mean square error (MSE) in the FO4 delays of the predicted and actual sizes may be computed and utilized to distinguish gate sizes that have FO4 delay values closer to the actual size from sizes whose FO4 delay values differ from the actual size by large amounts. The MSE in FO4 delay may be normalized to a range between 0 and 1, and applied as a weight in the CE loss. The system may therefore advantageously utilize a modification of the conventional multiclass CE loss function by weighting with the normalized MSE in FO4 delay for each observation i:

$$CE\ \text{Loss New} = -\sum_{c=1}^{L} W_{1,c} \cdot y_{i,c} \cdot \log(q_{i,c})$$

where $W_{i,c}$ is the normalized MSE in FO4 delay value for observation i if class $_c$ is its correct classification. With this modification, the new CE loss for $s_{k+1}$ is much smaller than so in the example above.

Modern high-performance, low-power industrial designs are typically implemented using multi-corner multi-mode (MCMM) constraints with multiple process/voltage/temperature (PVT) libraries and RC back-end corners. Heuristics for MCMM implementations of the disclosed mechanisms may determine a dominant scenario, and extract tokens only for that dominant scenario. A dominant scenario is the scenario comprising a largest magnitude of total negative slack (TNS) at the post-route stage. A FO4 delay characterization may be performed at the dominant scenario. In case different designs using the same set of libraries have different dominant scenarios, characterization may be performed done at each of these scenarios.

The transformer networks, algorithms, and other techniques disclosed herein may be implemented by computing devices utilizing one or more graphic processing unit (GPU) and/or general purpose data processor (e.g., a 'central processing unit or CPU). Exemplary architectures will now be described that may be configured to implement the transformer networks and carry out the techniques disclosed herein on such devices.

The following description may use certain acronyms and abbreviations as follows:

"DPC" refers to a "data processing cluster";
"GPC" refers to a "general processing cluster";
"I/O" refers to a "input/output";
"L1 cache" refers to "level one cache";
"L2 cache" refers to "level two cache";
"LSU" refers to a "load/store unit";
"MMU" refers to a "memory management unit";
"MPC" refers to an "M-pipe controller";
"PPU" refers to a "parallel processing unit";
"PROP" refers to a "pre-raster operations unit";
"ROP" refers to a "raster operations";
"SFU" refers to a "special function unit";
"SM" refers to a "streaming multiprocessor";
"Viewport SCC" refers to "viewport scale, cull, and clip";
"WDX" refers to a "work distribution crossbar"; and
"XBar" refers to a "crossbar".

Parallel Processing Unit

Figure 9:
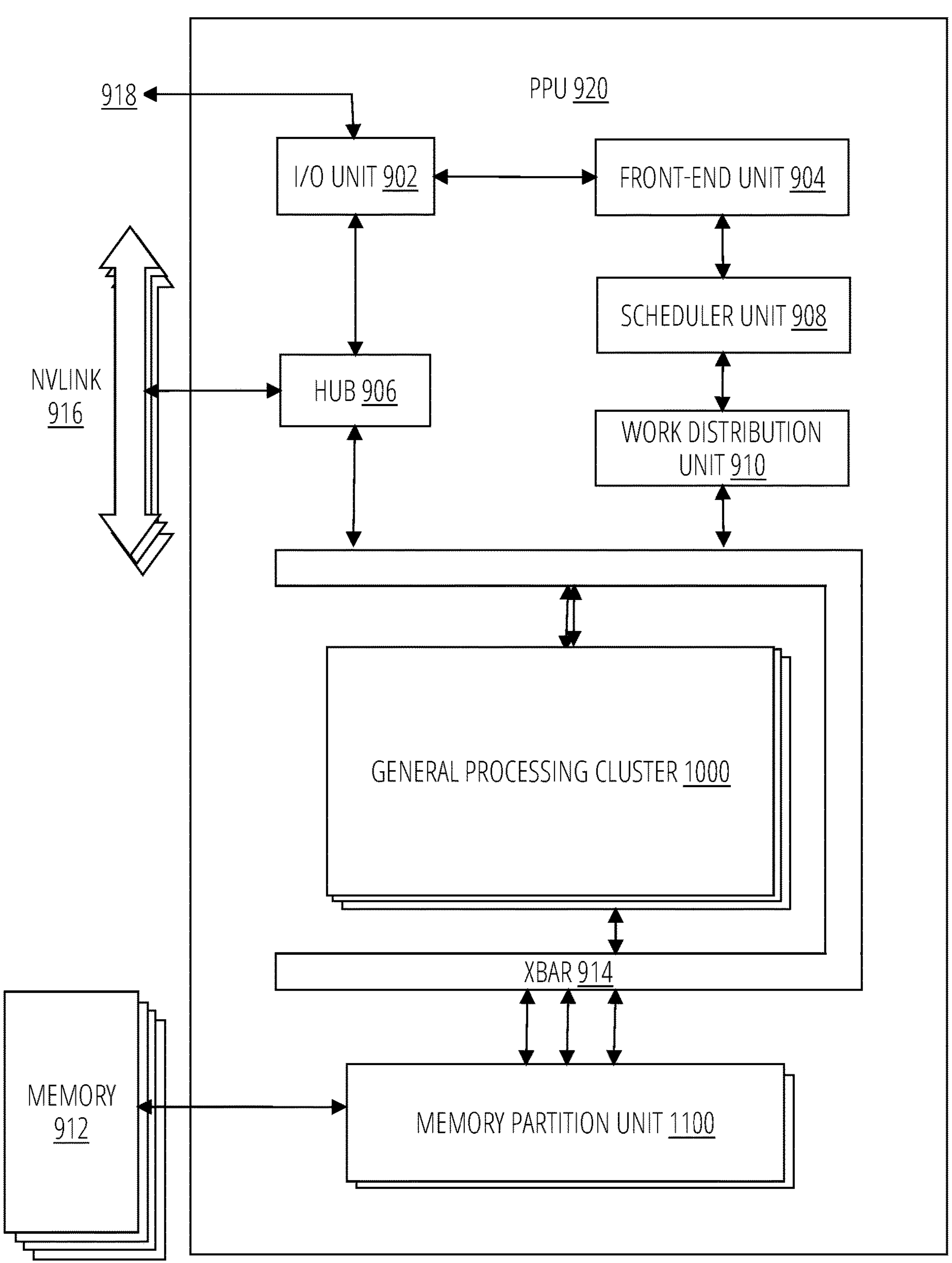
FIG. 9 depicts a parallel processing unit 920 in accordance with one embodiment.

FIG. 9 depicts a parallel processing unit 920, in accordance with an embodiment. In an embodiment, the parallel processing unit 920 is a multi-threaded processor that is implemented on one or more integrated circuit devices. The parallel processing unit 920 is a latency hiding architecture designed to process many threads in parallel. A thread (e.g., a thread of execution) is an instantiation of a set of instructions configured to be executed by the parallel processing unit 920. In an embodiment, the parallel processing unit 920 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 920 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 920 modules may be configured to accelerate thousands of High Performance Computing (HPC), data center, and machine learning applications. The parallel processing unit 920 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 9, the parallel processing unit 920 includes an I/O unit 902, a front-end unit 904, a scheduler unit 908, a work distribution unit 910, a hub 906, a crossbar 914, one or more general processing cluster 1000 modules, and one or more memory partition unit 1100 modules. The parallel processing unit 920 may be connected to a host processor or other parallel processing unit 920 modules via one or more high-speed NVLink 916 interconnects. The parallel processing unit 920 may be connected to a host processor or other peripheral devices via an interconnect 918. The parallel processing unit 920 may also be connected to a local memory comprising a number of memory 912 devices. In an embodiment, the local memory may comprise a number of dynamic random access memory (DRAM) devices. The DRAM devices may be configured as a high-bandwidth memory (HBM) subsystem, with multiple DRAM dies stacked within each device. The memory 912 may comprise logic to configure the parallel processing unit 920 to carry out aspects of the techniques disclosed herein.

The NVLink 916 interconnect enables systems to scale and include one or more parallel processing unit 920 modules combined with one or more CPUs, supports cache coherence between the parallel processing unit 920 modules and CPUs, and CPU mastering. Data and/or commands may be transmitted by the NVLink 916 through the hub 906 to/from other units of the parallel processing unit 920 such as one or more copy engines, a video encoder, a video decoder, a power management unit, etc. (not explicitly shown). The NVLink 916 is described in more detail in conjunction with FIG. 13.

The I/O unit 902 is configured to transmit and receive communications (e.g., commands, data, etc.) from a host processor (not shown) over the interconnect 918. The I/O unit 902 may communicate with the host processor directly via the interconnect 918 or through one or more intermediate devices such as a memory bridge. In an embodiment, the I/O unit 902 may communicate with one or more other processors, such as one or more parallel processing unit 920 modules via the interconnect 918. In an embodiment, the I/O unit 902 implements a Peripheral Component Interconnect Express (PCIe) interface for communications over a PCIe bus and the interconnect 918 is a PCIe bus. In alternative embodiments, the I/O unit 902 may implement other types of well-known interfaces for communicating with external devices.

The I/O unit 902 decodes packets received via the interconnect 918. In an embodiment, the packets represent commands configured to cause the parallel processing unit 920 to perform various operations. The I/O unit 902 transmits the decoded commands to various other units of the parallel processing unit 920 as the commands may specify. For example, some commands may be transmitted to the front-end unit 904. Other commands may be transmitted to the hub 906 or other units of the parallel processing unit 920 such as one or more copy engines, a video encoder, a video decoder, a power management unit, etc. (not explicitly shown). In other words, the I/O unit 902 is configured to route communications between and among the various logical units of the parallel processing unit 920.

In an embodiment, a program executed by the host processor encodes a command stream in a buffer that provides workloads to the parallel processing unit 920 for processing. A workload may comprise several instructions and data to be processed by those instructions. The buffer is a region in a memory that is accessible (e.g., read/write) by both the host processor and the parallel processing unit 920. For example, the I/O unit 902 may be configured to access the buffer in a system memory connected to the interconnect 918 via memory requests transmitted over the interconnect 918. In an embodiment, the host processor writes the command stream to the buffer and then transmits a pointer to the start of the command stream to the parallel processing unit 920. The front-end unit 904 receives pointers to one or more command streams. The front-end unit 904 manages the one or more streams, reading commands from the streams and forwarding commands to the various units of the parallel processing unit 920.

The front-end unit 904 is coupled to a scheduler unit 908 that configures the various general processing cluster 1000 modules to process tasks defined by the one or more streams. The scheduler unit 908 is configured to track state information related to the various tasks managed by the scheduler unit 908. The state may indicate which general processing cluster 1000 a task is assigned to, whether the task is active or inactive, a priority level associated with the task, and so forth. The scheduler unit 908 manages the execution of a plurality of tasks on the one or more general processing cluster 1000 modules.

The scheduler unit 908 is coupled to a work distribution unit 910 that is configured to dispatch tasks for execution on the general processing cluster 1000 modules. The work distribution unit 910 may track a number of scheduled tasks received from the scheduler unit 908. In an embodiment, the work distribution unit 910 manages a pending task pool and an active task pool for each of the general processing cluster 1000 modules. The pending task pool may comprise a number of slots (e.g., 32 slots) that contain tasks assigned to be processed by a particular general processing cluster 1000. The active task pool may comprise a number of slots (e.g., 4 slots) for tasks that are actively being processed by the general processing cluster 1000 modules. As a general processing cluster 1000 finishes the execution of a task, that task is evicted from the active task pool for the general processing cluster 1000 and one of the other tasks from the pending task pool is selected and scheduled for execution on the general processing cluster 1000. If an active task has been idle on the general processing cluster 1000, such as while waiting for a data dependency to be resolved, then the active task may be evicted from the general processing cluster 1000 and returned to the pending task pool while another task in the pending task pool is selected and scheduled for execution on the general processing cluster 1000.

The work distribution unit 910 communicates with the one or more general processing cluster 1000 modules via crossbar 914. The crossbar 914 is an interconnect network that couples many of the units of the parallel processing unit 920 to other units of the parallel processing unit 920. For example, the crossbar 914 may be configured to couple the work distribution unit 910 to a particular general processing cluster 1000. Although not shown explicitly, one or more other units of the parallel processing unit 920 may also be connected to the crossbar 914 via the hub 906.

The tasks are managed by the scheduler unit 908 and dispatched to a general processing cluster 1000 by the work distribution unit 910. The general processing cluster 1000 is configured to process the task and generate results. The results may be consumed by other tasks within the general processing cluster 1000, routed to a different general processing cluster 1000 via the crossbar 914, or stored in the memory 912. The results can be written to the memory 912 via the memory partition unit 1100 modules, which implement a memory interface for reading and writing data to/from the memory 912. The results can be transmitted to another parallel processing unit 920 or CPU via the NVLink 916. In an embodiment, the parallel processing unit 920 includes a number U of memory partition unit 1100 modules that is equal to the number of separate and distinct memory 912 devices coupled to the parallel processing unit 920. A memory partition unit 1100 will be described in more detail below in conjunction with FIG. 11.

In an embodiment, a host processor executes a driver kernel that implements an application programming interface (API) that enables one or more applications executing on the host processor to schedule operations for execution on the parallel processing unit 920. In an embodiment, multiple compute applications are simultaneously executed by the parallel processing unit 920 and the parallel processing unit 920 provides isolation, quality of service (QoS), and independent address spaces for the multiple compute applications. An application may generate instructions (e.g., API calls) that cause the driver kernel to generate one or more tasks for execution by the parallel processing unit 920. The driver kernel outputs tasks to one or more streams being processed by the parallel processing unit 920. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 12.

Figure 10:
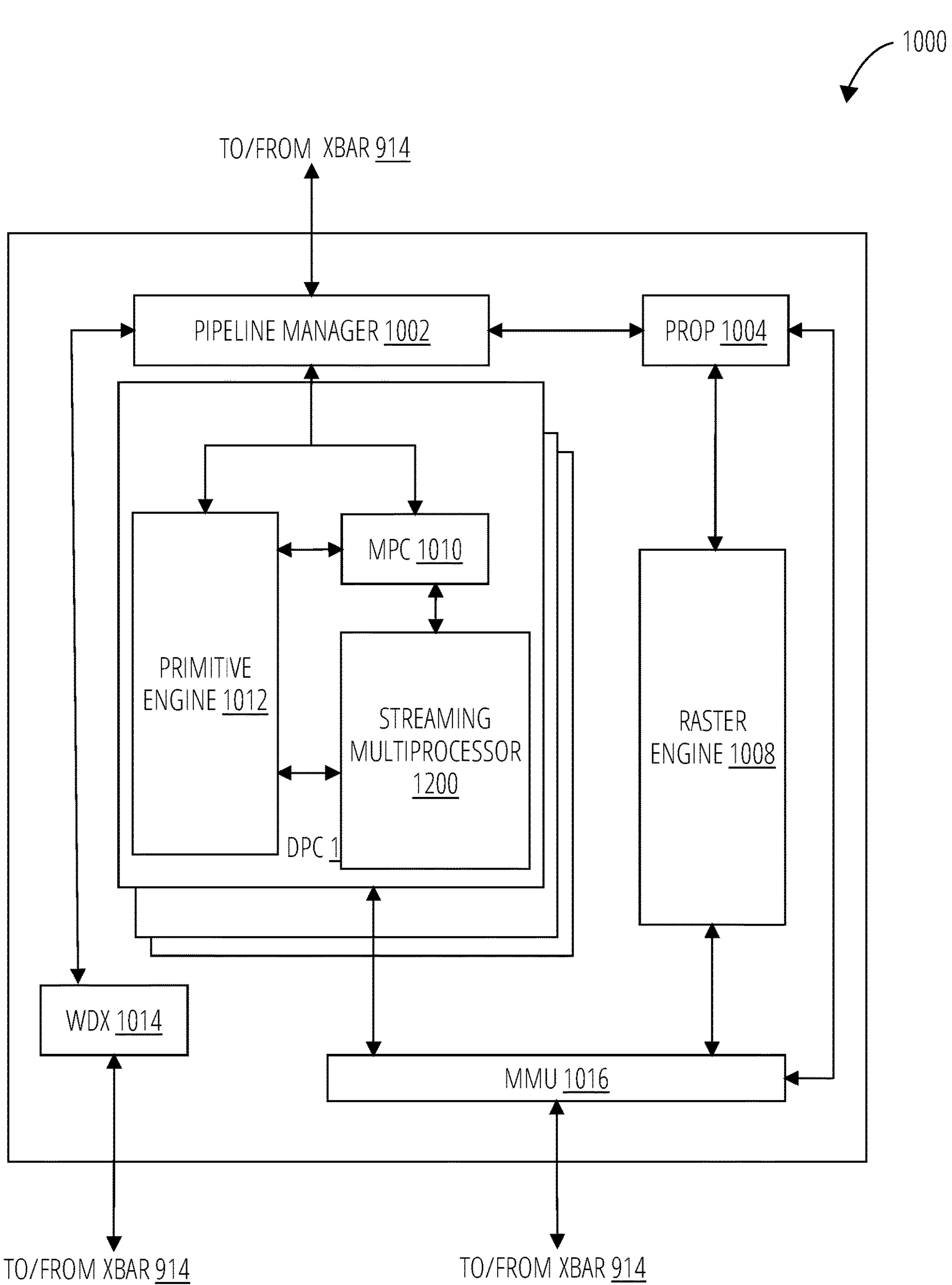
FIG. 10 depicts a general processing cluster 1000 in accordance with one embodiment.

FIG. 10 depicts a general processing cluster 1000 of the parallel processing unit 920 of FIG. 9, in accordance with an embodiment. As shown in FIG. 10, each general processing cluster 1000 includes a number of hardware units for processing tasks. In an embodiment, each general processing cluster 1000 includes a pipeline manager 1002, a pre-raster operations unit 1004, a raster engine 1008, a work distribution crossbar 1014, a memory management unit 1016, and one or more data processing cluster 1006. It will be appreciated that the general processing cluster 1000 of FIG. 10 may include other hardware units in lieu of or in addition to the units shown in FIG. 10.

In an embodiment, the operation of the general processing cluster 1000 is controlled by the pipeline manager 1002. The pipeline manager 1002 manages the configuration of the one or more data processing cluster 1006 modules for processing tasks allocated to the general processing cluster 1000. In an embodiment, the pipeline manager 1002 may configure at least one of the one or more data processing cluster 1006 modules to implement at least a portion of a graphics rendering pipeline. For example, a data processing cluster 1006 may be configured to execute a vertex shader program on the programmable streaming multiprocessor 1200. The pipeline manager 1002 may also be configured to route packets received from the work distribution unit 910 to the appropriate logical units within the general processing cluster 1000. For example, some packets may be routed to fixed function hardware units in the pre-raster operations unit 1004 and/or raster engine 1008 while other packets may be routed to the data processing cluster 1006 modules for processing by the primitive engine 1012 or the streaming multiprocessor 1200. In an embodiment, the pipeline manager 1002 may configure at least one of the one or more data processing cluster 1006 modules to implement a neural network model and/or a computing pipeline.

Figure 11:
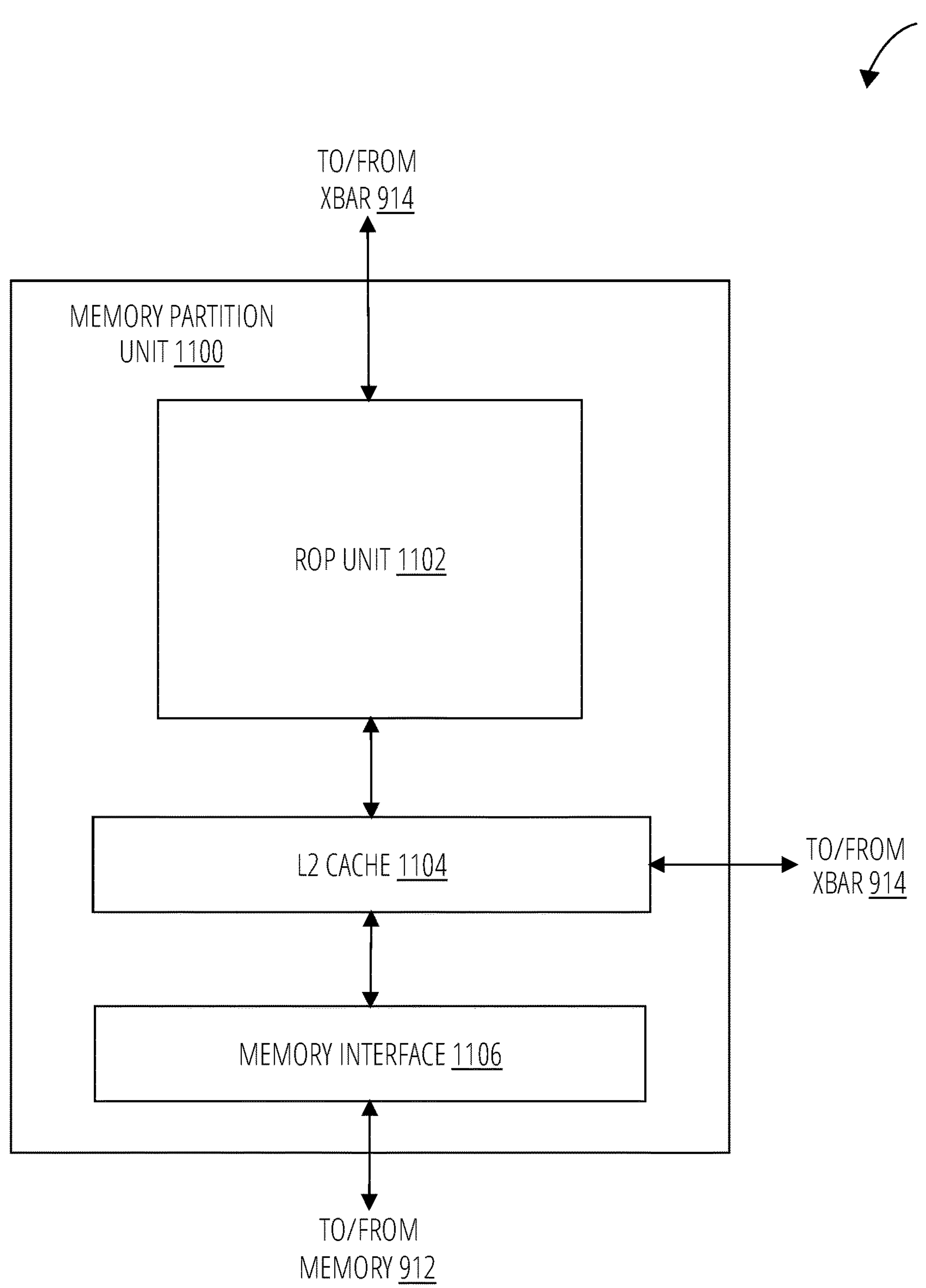
FIG. 11 depicts a memory partition unit 1100 in accordance with one embodiment.

The pre-raster operations unit 1004 is configured to route data generated by the raster engine 1008 and the data processing cluster 1006 modules to a Raster Operations (ROP) unit, described in more detail in conjunction with FIG. 11. The pre-raster operations unit 1004 may also be configured to perform optimizations for color blending, organize pixel data, perform address translations, and the like.

The raster engine 1008 includes a number of fixed function hardware units configured to perform various raster operations. In an embodiment, the raster engine 1008 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1008 comprises fragments to be processed, for example, by a fragment shader implemented within a data processing cluster 1006.

Each data processing cluster 1006 included in the general processing cluster 1000 includes an M-pipe controller 1010, a primitive engine 1012, and one or more streaming multiprocessor 1200 modules. The M-pipe controller 1010 controls the operation of the data processing cluster 1006, routing packets received from the pipeline manager 1002 to the appropriate units in the data processing cluster 1006. For example, packets associated with a vertex may be routed to the primitive engine 1012, which is configured to fetch vertex attributes associated with the vertex from the memory 912. In contrast, packets associated with a shader program may be transmitted to the streaming multiprocessor 1200.

The streaming multiprocessor 1200 comprises a programmable streaming processor that is configured to process tasks represented by a number of threads. Each streaming multiprocessor 1200 is multi-threaded and configured to execute a plurality of threads (e.g., 32 threads) from a particular group of threads concurrently. In an embodiment, the streaming multiprocessor 1200 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the streaming multiprocessor 1200 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The streaming multiprocessor 1200 will be described in more detail below in conjunction with FIG. 12.

The memory management unit 1016 provides an interface between the general processing cluster 1000 and the memory partition unit 1100. The memory management unit 1016 may provide translation of virtual addresses into physical addresses, memory protection, and arbitration of memory requests. In an embodiment, the memory management unit 1016 provides one or more translation lookaside buffers (TLBs) for performing translation of virtual addresses into physical addresses in the memory 912.

FIG. 11 depicts a memory partition unit 1100 of the parallel processing unit 920 of FIG. 9, in accordance with an embodiment. As shown in FIG. 11, the memory partition unit 1100 includes a raster operations unit 1102, a level two cache 1104, and a memory interface 1106. The memory interface 1106 is coupled to the memory 912. Memory interface 1106 may implement 32, 64, 128, 1024-bit data buses, or the like, for high-speed data transfer. In an embodiment, the parallel processing unit 920 incorporates U memory interface 1106 modules, one memory interface 1106 per pair of memory partition unit 1100 modules, where each pair of memory partition unit 1100 modules is connected to a corresponding memory 912 device. For example, parallel processing unit 920 may be connected to up to Y memory 912 devices, such as high bandwidth memory stacks or graphics double-data-rate, version 5, synchronous dynamic random access memory, or other types of persistent storage.

In an embodiment, the memory interface 1106 implements an HBM2 memory interface and Y equals half U. In an embodiment, the HBM2 memory stacks are located on the same physical package as the parallel processing unit 920, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 912 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 920 modules process very large datasets and/or run applications for extended periods.

In an embodiment, the parallel processing unit 920 implements a multi-level memory hierarchy. In an embodiment, the memory partition unit 1100 supports a unified memory to provide a single unified virtual address space for CPU and parallel processing unit 920 memory, enabling data sharing between virtual memory systems. In an embodiment the frequency of accesses by a parallel processing unit 920 to memory located on other processors is traced to ensure that memory pages are moved to the physical memory of the parallel processing unit 920 that is accessing the pages more frequently. In an embodiment, the NVLink 916 supports address translation services allowing the parallel processing unit 920 to directly access a CPU's page tables and providing full access to CPU memory by the parallel processing unit 920.

In an embodiment, copy engines transfer data between multiple parallel processing unit 920 modules or between parallel processing unit 920 modules and CPUs. The copy engines can generate page faults for addresses that are not mapped into the page tables. The memory partition unit 1100 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 912 or other system memory may be fetched by the memory partition unit 1100 and stored in the level two cache 1104, which is located on-chip and is shared between the various general processing cluster 1000 modules. As shown, each memory partition unit 1100 includes a portion of the level two cache 1104 associated with a corresponding memory 912 device. Lower level caches may then be implemented in various units within the general processing cluster 1000 modules. For example, each of the streaming multiprocessor 1200 modules may implement an L1 cache. The L1 cache is private memory that is dedicated to a particular streaming multiprocessor 1200. Data from the level two cache 1104 may be fetched and stored in each of the L1 caches for processing in the functional units of the streaming multiprocessor 1200 modules. The level two cache 1104 is coupled to the memory interface 1106 and the crossbar 914.

The raster operations unit 1102 performs graphics raster operations related to pixel color, such as color compression, pixel blending, and the like. The raster operations unit 1102 also implements depth testing in conjunction with the raster engine 1008, receiving a depth for a sample location associated with a pixel fragment from the culling engine of the raster engine 1008. The depth is tested against a corresponding depth in a depth buffer for a sample location associated with the fragment. If the fragment passes the depth test for the sample location, then the raster operations unit 1102 updates the depth buffer and transmits a result of the depth test to the raster engine 1008. It will be appreciated that the number of partition memory partition unit 1100 modules may be different than the number of general processing cluster 1000 modules and, therefore, each raster operations unit 1102 may be coupled to each of the general processing cluster 1000 modules. The raster operations unit 1102 tracks packets received from the different general processing cluster 1000 modules and determines which general processing cluster 1000 that a result generated by the raster operations unit 1102 is routed to through the crossbar 914. Although the raster operations unit 1102 is included within the memory partition unit 1100 in FIG. 11, in other embodiment, the raster operations unit 1102 may be outside of the memory partition unit 1100. For example, the raster operations unit 1102 may reside in the general processing cluster 1000 or another unit.

Figure 12:
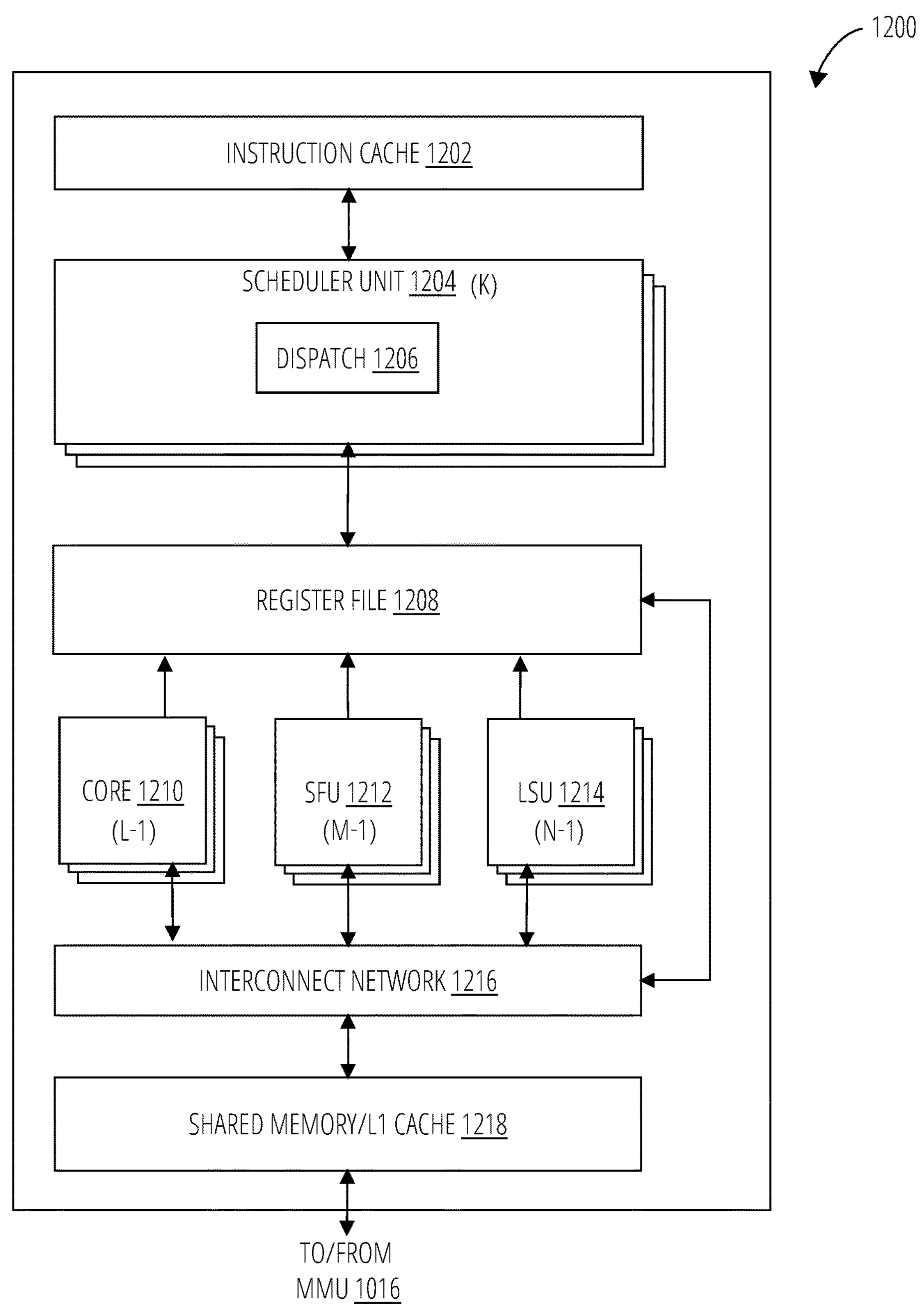
FIG. 12 depicts a streaming multiprocessor 1200 in accordance with one embodiment.

FIG. 12 illustrates the streaming multiprocessor 1200 of FIG. 10, in accordance with an embodiment. As shown in FIG. 12, the streaming multiprocessor 1200 includes an instruction cache 1202, one or more scheduler unit 1204 modules (e.g., such as scheduler unit 908), a register file 1208, one or more processing core 1210 modules, one or more special function unit 1212 modules, one or more load/store unit 1214 modules, an interconnect network 1216, and a shared memory/L1 cache 1218.

As described above, the work distribution unit 910 dispatches tasks for execution on the general processing cluster 1000 modules of the parallel processing unit 920. The tasks are allocated to a particular data processing cluster 1006 within a general processing cluster 1000 and, if the task is associated with a shader program, the task may be allocated to a streaming multiprocessor 1200. The scheduler unit 908 receives the tasks from the work distribution unit 910 and manages instruction scheduling for one or more thread blocks assigned to the streaming multiprocessor 1200. The scheduler unit 1204 schedules thread blocks for execution as warps of parallel threads, where each thread block is allocated at least one warp. In an embodiment, each warp executes 32 threads. The scheduler unit 1204 may manage a plurality of different thread blocks, allocating the warps to the different thread blocks and then dispatching instructions from the plurality of different cooperative groups to the various functional units (e.g., core 1210 modules, special function unit 1212 modules, and load/store unit 1214 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1206 unit is configured within the scheduler unit 1204 to transmit instructions to one or more of the functional units. In one embodiment, the scheduler unit 1204 includes two dispatch 1206 units that enable two different instructions from the same warp to be dispatched during each clock cycle. In alternative embodiments, each scheduler unit 1204 may include a single dispatch 1206 unit or additional dispatch 1206 units.

Each streaming multiprocessor 1200 includes a register file 1208 that provides a set of registers for the functional units of the streaming multiprocessor 1200. In an embodiment, the register file 1208 is divided between each of the functional units such that each functional unit is allocated a dedicated portion of the register file 1208. In another embodiment, the register file 1208 is divided between the different warps being executed by the streaming multiprocessor 1200. The register file 1208 provides temporary storage for operands connected to the data paths of the functional units.

Each streaming multiprocessor 1200 comprises L processing core 1210 modules. In an embodiment, the streaming multiprocessor 1200 includes a large number (e.g., 128, etc.) of distinct processing core 1210 modules. Each core 1210 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1210 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1210 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each streaming multiprocessor 1200 also comprises M special function unit 1212 modules that perform special functions (e.g., attribute evaluation, reciprocal square root, and the like). In an embodiment, the special function unit 1212 modules may include a tree traversal unit configured to traverse a hierarchical tree data structure. In an embodiment, the special function unit 1212 modules may include texture unit configured to perform texture map filtering operations. In an embodiment, the texture units are configured to load texture maps (e.g., a 2D array of texels) from the memory 912 and sample the texture maps to produce sampled texture values for use in shader programs executed by the streaming multiprocessor 1200. In an embodiment, the texture maps are stored in the shared memory/L1 cache 1218. The texture units implement texture operations such as filtering operations using mip-maps (e.g., texture maps of varying levels of detail). In an embodiment, each streaming multiprocessor 1200 includes two texture units.

Each streaming multiprocessor 1200 also comprises N load/store unit 1214 modules that implement load and store operations between the shared memory/L1 cache 1218 and the register file 1208. Each streaming multiprocessor 1200 includes an interconnect network 1216 that connects each of the functional units to the register file 1208 and the load/store unit 1214 to the register file 1208 and shared memory/L1 cache 1218. In an embodiment, the interconnect network 1216 is a crossbar that can be configured to connect any of the functional units to any of the registers in the register file 1208 and connect the load/store unit 1214 modules to the register file 1208 and memory locations in shared memory/L1 cache 1218.

The shared memory/L1 cache 1218 is an array of on-chip memory that allows for data storage and communication between the streaming multiprocessor 1200 and the primitive engine 1012 and between threads in the streaming multiprocessor 1200. In an embodiment, the shared memory/L1 cache 1218 comprises 128 KB of storage capacity and is in the path from the streaming multiprocessor 1200 to the memory partition unit 1100. The shared memory/L1 cache 1218 can be used to cache reads and writes. One or more of the shared memory/L1 cache 1218, level two cache 1104, and memory 912 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1218 enables the shared memory/L1 cache 1218 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 9, are bypassed, creating a much simpler programming model. In the general purpose parallel computation configuration, the work distribution unit 910 assigns and distributes blocks of threads directly to the data processing cluster 1006 modules. The threads in a block execute the same program, using a unique thread ID in the calculation to ensure each thread generates unique results, using the streaming multiprocessor 1200 to execute the program and perform calculations, shared memory/L1 cache 1218 to communicate between threads, and the load/store unit 1214 to read and write global memory through the shared memory/L1 cache 1218 and the memory partition unit 1100. When configured for general purpose parallel computation, the streaming multiprocessor 1200 can also write commands that the scheduler unit 908 can use to launch new work on the data processing cluster 1006 modules.

The parallel processing unit 920 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 920 is embodied on a single semiconductor substrate. In another embodiment, the parallel processing unit 920 is included in a system-on-a-chip (SoC) along with one or more other devices such as additional parallel processing unit 920 modules, the memory 912, a reduced instruction set computer (RISC) CPU, a memory management unit (MMU), a digital-to-analog converter (DAC), and the like.

In an embodiment, the parallel processing unit 920 may be included on a graphics card that includes one or more memory devices. The graphics card may be configured to interface with a PCIe slot on a motherboard of a desktop computer. In yet another embodiment, the parallel processing unit 920 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 13:
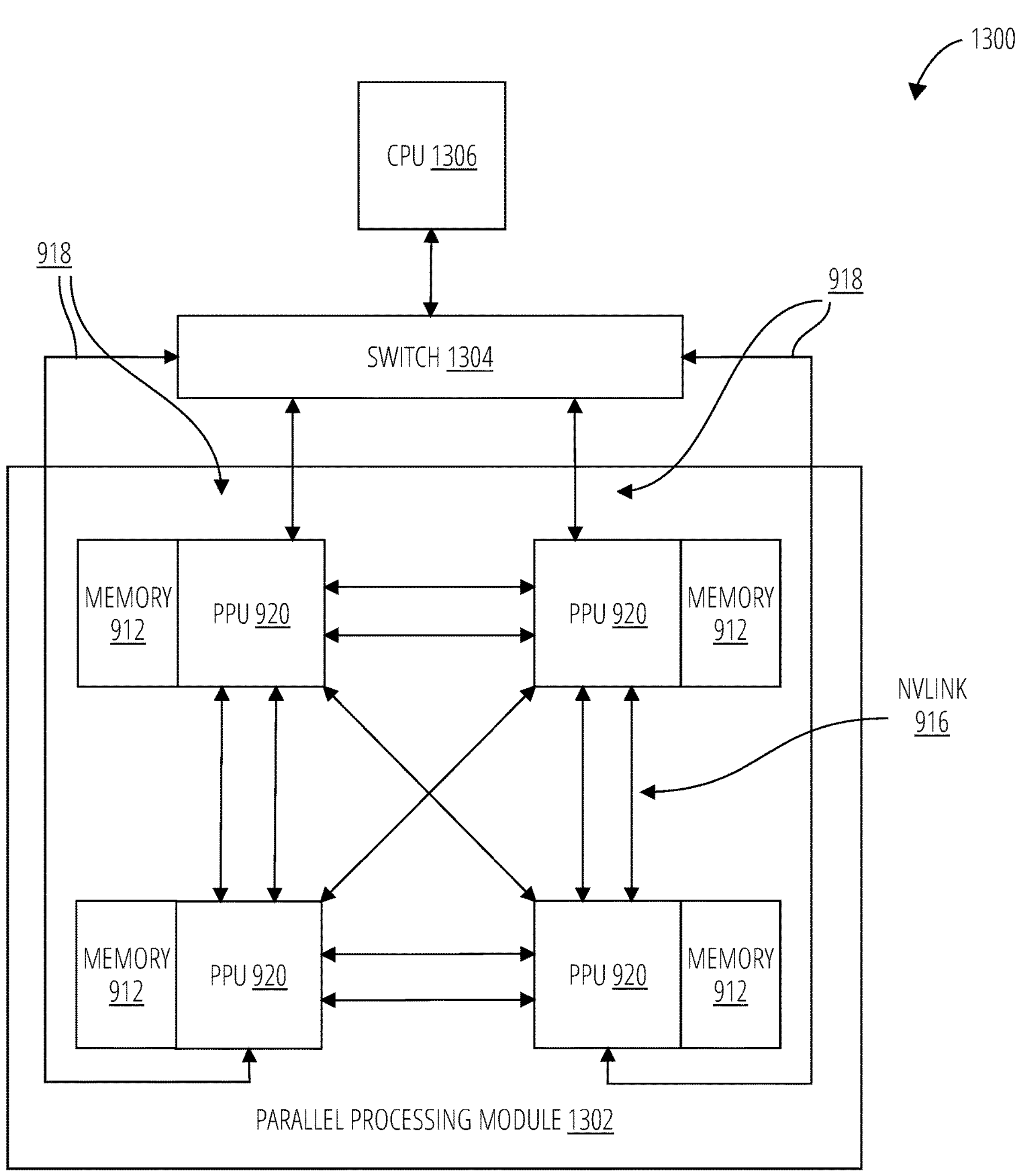
FIG. 13 depicts a processing system 1300 in accordance with one embodiment.

FIG. 13 is a conceptual diagram of a processing system 1300 implemented using the parallel processing unit 920 of FIG. 9, in accordance with an embodiment. The processing system 1300 includes a central processing unit 1306, switch 1304, and multiple parallel processing unit 920 modules each and respective memory 912 modules. The NVLink 916 provides high-speed communication links between each of the parallel processing unit 920 modules. Although a particular number of NVLink 916 and interconnect 918 connections are illustrated in FIG. 13, the number of connections to each parallel processing unit 920 and the central processing unit 1306 may vary. The switch 1304 interfaces between the interconnect 918 and the central processing unit 1306. The parallel processing unit 920 modules, memory 912 modules, and NVLink 916 connections may be situated on a single semiconductor platform to form a parallel processing module 1302. In an embodiment, the switch 1304 supports two or more protocols to interface between various different connections and/or links.

In another embodiment (not shown), the NVLink 916 provides one or more high-speed communication links between each of the parallel processing unit modules (parallel processing unit 920, parallel processing unit 920, parallel processing unit 920, and parallel processing unit 920) and the central processing unit 1306 and the switch 1304 interfaces between the interconnect 918 and each of the parallel processing unit modules. The parallel processing unit modules, memory 912 modules, and interconnect 918 may be situated on a single semiconductor platform to form a parallel processing module 1302. In yet another embodiment (not shown), the interconnect 918 provides one or more communication links between each of the parallel processing unit modules and the central processing unit 1306 and the switch 1304 interfaces between each of the parallel processing unit modules using the NVLink 916 to provide one or more high-speed communication links between the parallel processing unit modules. In another embodiment (not shown), the NVLink 916 provides one or more high-speed communication links between the parallel processing unit modules and the central processing unit 1306 through the switch 1304. In yet another embodiment (not shown), the interconnect 918 provides one or more communication links between each of the parallel processing unit modules directly. One or more of the NVLink 916 high-speed communication links may be implemented as a physical NVLink interconnect or either an on-chip or on-die interconnect using the same protocol as the NVLink 916.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1302 may be implemented as a circuit board substrate and each of the parallel processing unit modules and/or memory 912 modules may be packaged devices. In an embodiment, the central processing unit 1306, switch 1304, and the parallel processing module 1302 are situated on a single semiconductor platform.

In an embodiment, the signaling rate of each NVLink 916 is 20 to 25 Gigabits/second and each parallel processing unit module includes six NVLink 916 interfaces (as shown in FIG. 13, five NVLink 916 interfaces are included for each parallel processing unit module). Each NVLink 916 provides a data transfer rate of 25 Gigabytes/second in each direction, with six links providing 300 Gigabytes/second. The NVLink 916 can be used exclusively for PPU-to-PPU communication as shown in FIG. 13, or some combination of PPU-to-PPU and PPU-to-CPU, when the central processing unit 1306 also includes one or more NVLink 916 interfaces.

In an embodiment, the NVLink 916 allows direct load/store/atomic access from the central processing unit 1306 to each parallel processing unit module's memory 912. In an embodiment, the NVLink 916 supports coherency operations, allowing data read from the memory 912 modules to be stored in the cache hierarchy of the central processing unit 1306, reducing cache access latency for the central processing unit 1306. In an embodiment, the NVLink 916 includes support for Address Translation Services (ATS), enabling the parallel processing unit module to directly access page tables within the central processing unit 1306. One or more of the NVLink 916 may also be configured to operate in a low-power mode.

Figure 14:
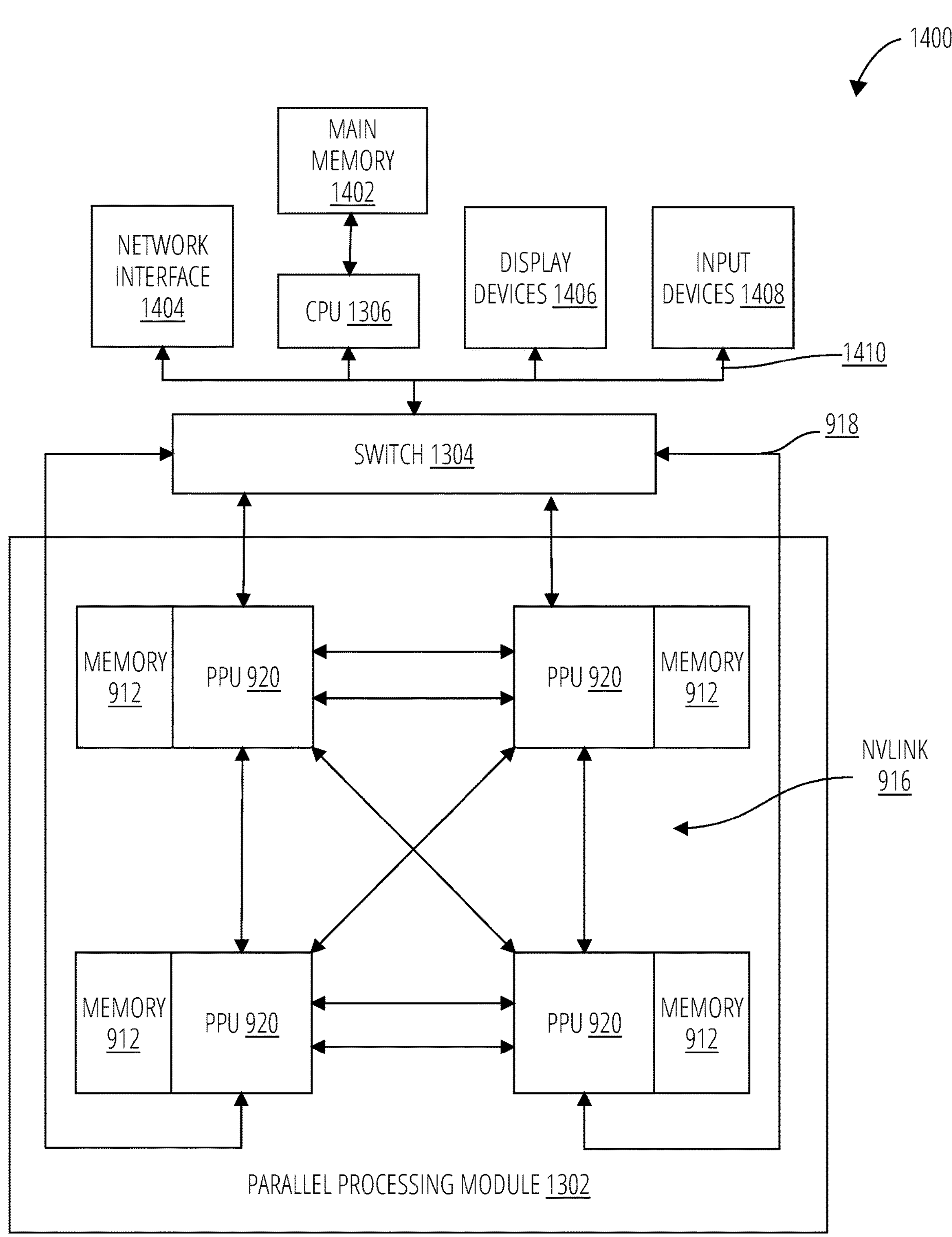
FIG. 14 depicts an exemplary processing system 1400 in accordance with another embodiment.

FIG. 14 depicts an exemplary processing system 1400 in which the various architecture and/or functionality of the various previous embodiments may be implemented. As shown, an exemplary processing system 1400 is provided including at least one central processing unit 1306 that is connected to a communications bus 1410. The communication communications bus 1410 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 1400 also includes a main memory 1402. Control logic (software) and data are stored in the main memory 1402 which may take the form of random access memory (RAM).

The exemplary processing system 1400 also includes input devices 1408, the parallel processing module 1302, and display devices 1406, e.g. a conventional CRT (cathode ray tube), LCD (liquid crystal display), LED (light emitting diode), plasma display or the like. User input may be received from the input devices 1408, e.g., keyboard, mouse, touchpad, microphone, and the like. Each of the foregoing modules and/or devices may even be situated on a single semiconductor platform to form the exemplary processing system 1400. Alternately, the various modules may also be situated separately or in various combinations of semiconductor platforms per the desires of the user.

Further, the exemplary processing system 1400 may be coupled to a network (e.g., a telecommunications network, local area network (LAN), wireless network, wide area network (WAN) such as the Internet, peer-to-peer network, cable network, or the like) through a network interface 1404 for communication purposes.

The exemplary processing system 1400 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1402 and/or the secondary storage. Such computer programs, when executed, enable the exemplary processing system 1400 to perform various functions. The main memory 1402, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 1400 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

Figure 15:
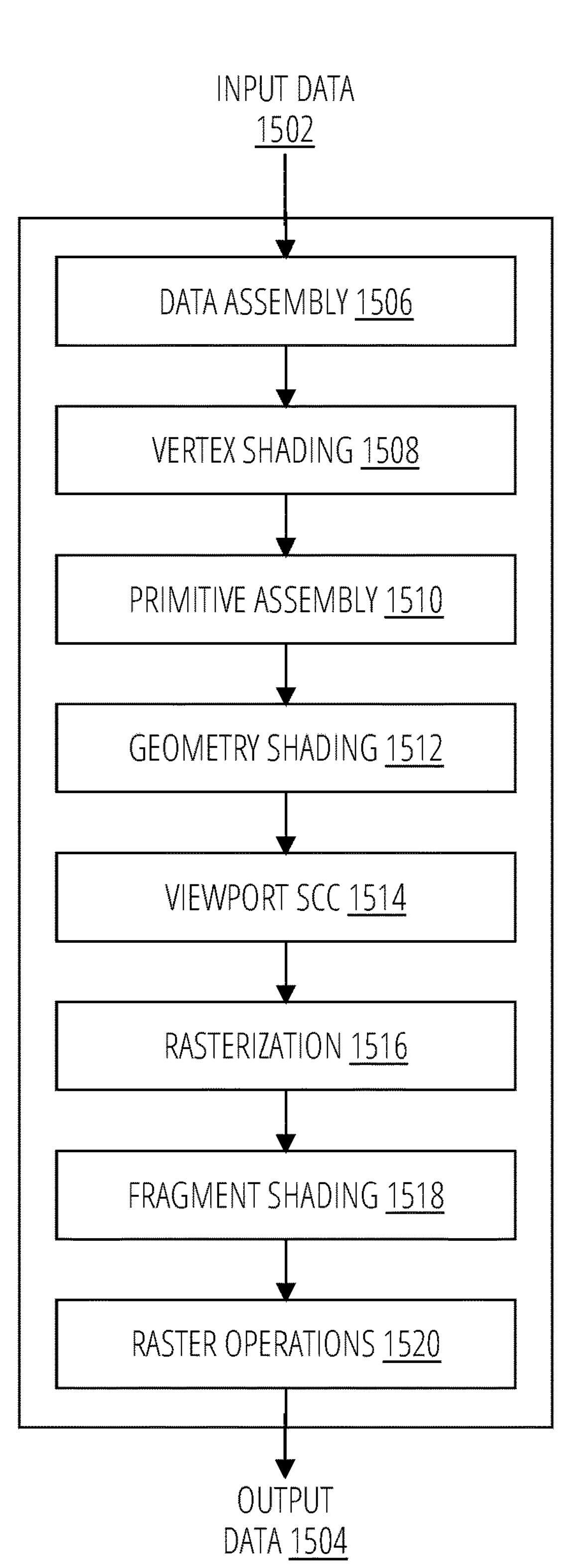
FIG. 15 depicts a graphics processing pipeline 1500 in accordance with one embodiment.

FIG. 15 is a conceptual diagram of a graphics processing pipeline 1500 implemented by the parallel processing unit 920 of FIG. 9, in accordance with an embodiment. In an embodiment, the parallel processing unit 920 comprises a graphics processing unit (GPU). The parallel processing unit 920 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 920 can be configured to process the graphics primitives to generate a frame buffer (e.g., pixel data for each of the pixels of the display).

An application writes model data for a scene (e.g., a collection of vertices and attributes) to a memory such as a system memory or memory 912. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the streaming multiprocessor 1200 modules of the parallel processing unit 920 including one or more of a vertex shader, hull shader, domain shader, geometry shader, and a pixel shader. For example, one or more of the streaming multiprocessor 1200 modules may be configured to execute a vertex shader program that processes a number of vertices defined by the model data. In an embodiment, the different streaming multiprocessor 1200 modules may be configured to execute different shader programs concurrently. For example, a first subset of streaming multiprocessor 1200 modules may be configured to execute a vertex shader program while a second subset of streaming multiprocessor 1200 modules may be configured to execute a pixel shader program. The first subset of streaming multiprocessor 1200 modules processes vertex data to produce processed vertex data and writes the processed vertex data to the level two cache 1104 and/or the memory 912. After the processed vertex data is rasterized (e.g., transformed from three-dimensional data into two-dimensional data in screen space) to produce fragment data, the second subset of streaming multiprocessor 1200 modules executes a pixel shader to produce processed fragment data, which is then blended with other processed fragment data and written to the frame buffer in memory 912. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 1500 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1500 receives input data 601 that is transmitted from one stage to the next stage of the graphics processing pipeline 1500 to generate output data 1504. In an embodiment, the graphics processing pipeline 1500 may represent a graphics processing pipeline defined by the OpenGL® API. As an option, the graphics processing pipeline 1500 may be implemented in the context of the functionality and architecture of the previous Figures and/or any subsequent Figure(s).

As shown in FIG. 15, the graphics processing pipeline 1500 comprises a pipeline architecture that includes a number of stages. The stages include, but are not limited to, a data assembly 1506 stage, a vertex shading 1508 stage, a primitive assembly 1510 stage, a geometry shading 1512 stage, a viewport SCC 1514 stage, a rasterization 1516 stage, a fragment shading 1518 stage, and a raster operations 1520 stage. In an embodiment, the input data 1502 comprises commands that configure the processing units to implement the stages of the graphics processing pipeline 1500 and geometric primitives (e.g., points, lines, triangles, quads, triangle strips or fans, etc.) to be processed by the stages. The output data 1504 may comprise pixel data (e.g., color data) that is copied into a frame buffer or other type of surface data structure in a memory.

The data assembly 1506 stage receives the input data 1502 that specifies vertex data for high-order surfaces, primitives, or the like. The data assembly 1506 stage collects the vertex data in a temporary storage or queue, such as by receiving a command from the host processor that includes a pointer to a buffer in memory and reading the vertex data from the buffer. The vertex data is then transmitted to the vertex shading 1508 stage for processing.

The vertex shading 1508 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 1508 stage may manipulate individual vertex attributes such as position, color, texture coordinates, and the like. In other words, the vertex shading 1508 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 1508 stage generates transformed vertex data that is transmitted to the primitive assembly 1510 stage.

The primitive assembly 1510 stage collects vertices output by the vertex shading 1508 stage and groups the vertices into geometric primitives for processing by the geometry shading 1512 stage. For example, the primitive assembly 1510 stage may be configured to group every three consecutive vertices as a geometric primitive (e.g., a triangle) for transmission to the geometry shading 1512 stage. In some embodiments, specific vertices may be reused for consecutive geometric primitives (e.g., two consecutive triangles in a triangle strip may share two vertices). The primitive assembly 1510 stage transmits geometric primitives (e.g., a collection of associated vertices) to the geometry shading 1512 stage.

The geometry shading 1512 stage processes geometric primitives by performing a set of operations (e.g., a geometry shader or program) on the geometric primitives. Tessellation operations may generate one or more geometric primitives from each geometric primitive. In other words, the geometry shading 1512 stage may subdivide each geometric primitive into a finer mesh of two or more geometric primitives for processing by the rest of the graphics processing pipeline 1500. The geometry shading 1512 stage transmits geometric primitives to the viewport SCC 1514 stage.

In an embodiment, the graphics processing pipeline 1500 may operate within a streaming multiprocessor and the vertex shading 1508 stage, the primitive assembly 1510 stage, the geometry shading 1512 stage, the fragment shading 1518 stage, and/or hardware/software associated therewith, may sequentially perform processing operations. Once the sequential processing operations are complete, in an embodiment, the viewport SCC 1514 stage may utilize the data. In an embodiment, primitive data processed by one or more of the stages in the graphics processing pipeline 1500 may be written to a cache (e.g. L1 cache, a vertex cache, etc.). In this case, in an embodiment, the viewport SCC 1514 stage may access the data in the cache. In an embodiment, the viewport SCC 1514 stage and the rasterization 1516 stage are implemented as fixed function circuitry.

The viewport SCC 1514 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 1516 stage.

The rasterization 1516 stage converts the 3D geometric primitives into 2D fragments (e.g. capable of being utilized for display, etc.). The rasterization 1516 stage may be configured to utilize the vertices of the geometric primitives to setup a set of plane equations from which various attributes can be interpolated. The rasterization 1516 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 1516 stage generates fragment data (e.g., interpolated vertex attributes associated with a particular sample location for each covered pixel) that are transmitted to the fragment shading 1518 stage.

The fragment shading 1518 stage processes fragment data by performing a set of operations (e.g., a fragment shader or a program) on each of the fragments. The fragment shading 1518 stage may generate pixel data (e.g., color values) for the fragment such as by performing lighting operations or sampling texture maps using interpolated texture coordinates for the fragment. The fragment shading 1518 stage generates pixel data that is transmitted to the raster operations 1520 stage.

The raster operations 1520 stage may perform various operations on the pixel data such as performing alpha tests, stencil tests, and blending the pixel data with other pixel data corresponding to other fragments associated with the pixel. When the raster operations 1520 stage has finished processing the pixel data (e.g., the output data 1504), the pixel data may be written to a render target such as a frame buffer, a color buffer, or the like.

It will be appreciated that one or more additional stages may be included in the graphics processing pipeline 1500 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 1512 stage). Other types of graphics processing pipelines are contemplated as being within the scope of the present disclosure. Furthermore, any of the stages of the graphics processing pipeline 1500 may be implemented by one or more dedicated hardware units within a graphics processor such as parallel processing unit 920. Other stages of the graphics processing pipeline 1500 may be implemented by programmable hardware units such as the streaming multiprocessor 1200 of the parallel processing unit 920.

The graphics processing pipeline 1500 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 920. The API provides an abstraction for a programmer that lets a programmer utilize specialized graphics hardware, such as the parallel processing unit 920, to generate the graphical data without requiring the programmer to utilize the specific instruction set for the parallel processing unit 920. The application may include an API call that is routed to the device driver for the parallel processing unit 920. The device driver interprets the API call and performs various operations to respond to the API call. In some instances, the device driver may perform operations by executing instructions on the CPU. In other instances, the device driver may perform operations, at least in part, by launching operations on the parallel processing unit 920 utilizing an input/output interface between the CPU and the parallel processing unit 920. In an embodiment, the device driver is configured to implement the graphics processing pipeline 1500 utilizing the hardware of the parallel processing unit 920.

Various programs may be executed within the parallel processing unit 920 in order to implement the various stages of the graphics processing pipeline 1500. For example, the device driver may launch a kernel on the parallel processing unit 920 to perform the vertex shading 1508 stage on one streaming multiprocessor 1200 (or multiple streaming multiprocessor 1200 modules). The device driver (or the initial kernel executed by the parallel processing unit 920) may also launch other kernels on the parallel processing unit 920 to perform other stages of the graphics processing pipeline 1500, such as the geometry shading 1512 stage and the fragment shading 1518 stage. In addition, some of the stages of the graphics processing pipeline 1500 may be implemented on fixed unit hardware such as a rasterizer or a data assembler implemented within the parallel processing unit 920. It will be appreciated that results from one kernel may be processed by one or more intervening fixed function hardware units before being processed by a subsequent kernel on a streaming multiprocessor 1200.

LISTING OF DRAWING ELEMENTS

102 synchronous circuit
104 synchronous circuit
106 combinatorial circuits
202 transformer neural network
204 input sequence
206 encoder
208 encoder stack
210 encoder
212 encoder
214 decoder stack
216 decoder
218 decoder
220 decoder
222 output sequence

302 encoder
304 self-attention layer
306 feed forward neural network
402 decoder
404 encoder-decoder attention layer
406 self-attention layer
408 feed forward neural network
502 attention layer
504 matrix multiply
506 query vectors
508 key vectors
510 value vectors
512 scores vector
514 dot product
516 Softmax
518 multiply
520 vector summation
602 encoder
604 decoder
606 fully-connected layer
608 Softmax layer
802 encoder stage
804 encoder stage
806 decoder stage
808 decoder stage
810 self-attention layer
812 add-and-normalize layer
814 feed-forward layer
816 feed-forward layer
818 add-and-normalize layer
820 self-attention layer
822 add-and-normalize layer
824 encoder-decoder-attention layer
826 add-and-normalize layer
828 feed-forward layer
830 feed-forward layer
832 add-and-normalize layer
834 linear layer
836 Softmax layer
902 I/O unit
904 front-end unit
906 hub
908 scheduler unit
910 work distribution unit
912 memory
914 crossbar
916 NVLink
918 interconnect
920 parallel processing unit
1000 general processing cluster
1002 pipeline manager
1004 pre-raster operations unit
1006 data processing cluster
1008 raster engine
1010 M-pipe controller
1012 primitive engine
1014 work distribution crossbar
1016 memory management unit
1100 memory partition unit
1102 raster operations unit
1104 level two cache
1106 memory interface
1200 streaming multiprocessor
1202 instruction cache
1204 scheduler unit
1206 dispatch
1208 register file
1210 core
1212 special function unit
1214 load/store unit
1216 interconnect network
1218 shared memory/L1 cache
1300 processing system
1302 parallel processing module
1304 switch
1306 central processing unit
1400 exemplary processing system
1402 main memory
1404 network interface
1406 display devices
1408 input devices
1410 communications bus
1500 graphics processing pipeline
1502 input data
1504 output data
1506 data assembly
1508 vertex shading
1510 primitive assembly
1512 geometry shading
1514 viewport SCC
1516 rasterization
1518 fragment shading
1520 raster operations Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A transformer network for setting characteristics of gates in a circuit, the transformer network trained with gate characteristic distributions from a technology library, the transformer network comprising:

an encoder configured to transform a sequence of gate types for a combinatorial circuit path in the circuit into encoder outputs; and a decoder configured to transform the encoder outputs, an effort level setting, and the sequence of gate types into a sequence of gate sizes for the combinatorial circuit path, wherein the effort level setting comprises a ratio of a median signal propagation delay and an actual signal propagation delay for the sequence of gate types.

2. The transformer network of claim 1, wherein the median delay is a sum of a median fanout-of-four (FO4) delay of each gate type in the the sequence of gate types.

3. The transformer network of claim 1, further comprising:

a weighted cross-entropy loss function employing as a weight value a normalized mean square error (MSE) of FO4 delay values of the gates in the sequence of gate types.

4. The transformer network of claim 1, the transformer network further configured to:

select sizes of gates in the sequence of gate types to optimize timing, power, area, or combinations thereof for the sequence of gate types.

5. The transformer network of claim 1, wherein the transformer network models the propagation of signals through the sequence of gate types.

6. The transformer network of claim 1, wherein the encoder and the decoder each comprise exactly two encoding and decoding stages, respectively.

7. A method for setting gate sizes in a circuit path, the method comprising:

applying, to an encoder of a transformer network, gate types for each gate in the circuit path;

applying, to a decoder of the transformer network, outputs of the encoder, and a token sequence comprising as a starting token an effort level and a first gate type of the gate type sequence, whereafter the token sequence comprises <predicted $k^{th}$ gate size, $(k+1)^{th}$ gate type> pairs and k is a gate position index in the circuit path; and the transformer network generating a sequence of the gate sizes from the gate types, effort level, and predicted gate sizes.

8. The method of claim 7, wherein the circuit path comprises a combinatorial gate sequence between a start point and an endpoint, and wherein the start point comprises one of a primary input and a first synchronous circuit element, and wherein the endpoint comprises one of a primary output and a second synchronous circuit element.

9. The method of claim 7, wherein the effort level setting comprises a ratio of a median delay and an actual delay for the circuit path.

10. The method of claim 9, wherein the median delay is a sum of a median fanout-of-four (FO4) delay of each gate type in the circuit path.

11. The method network of claim 7, further comprising: utilizing in the transformer network a loss function weighted by a mean square error (MSE) of FO4 delay values for the gates in the circuit path.

12. The method of claim 7, further comprising: setting the gate sizes to optimize timing, power, area, or combinations thereof for the circuit path.

13. The method of claim 7, wherein the encoder comprises a plurality of encoding stages and each encoding stage outputs to a corresponding stage of the decoder.

14. A system comprising:

at least one processor; and at least one memory implementing logic to:

operate a transformer network encoder to transform a sequence of gate types for a combinatorial circuit path into encoder outputs;

apply the encoder outputs to a decoder of the transformer network;

further apply to the decoder a token sequence comprising an effort level, the sequence of gate types, and predicted sizes for gates of the combinatorial circuit path; and operate the decoder to generate a sequence of gate sizes for the combinatorial circuit path from the gate types, effort level, encoder outputs, and predicted gate sizes.

15. The system of claim 14, wherein the at least one processor comprises a graphics processing unit.

16. The system of claim 14, wherein the combinatorial circuit path comprises a start point and an endpoint, and wherein the start point comprises one of a primary input and a first synchronous circuit element, and wherein the endpoint comprises one of a primary output and a second synchronous circuit element.

17. The system of claim 14, wherein the effort level setting comprises a ratio of a median delay and an actual delay for the circuit path.

18. The system of claim 17, wherein the median delay is a sum of a median fanout-of-four (FO4) delay of each gate type in the circuit path.

19. The system of claim 14, the memory further implementing logic to:

implement a loss function weighted by a mean square error (MSE) of FO4 delay values for the gates of the combinatorial circuit path.

20. A process comprising:

operating a transformer network encoder to transform a sequence of gate types for a combinatorial circuit path into encoder outputs;

applying the encoder outputs to a decoder of the transformer network;

further applying to the decoder a token sequence comprising an effort level, the sequence of gate types, and predicted sizes for gates of the combinatorial circuit path; and operating the decoder to generate a sequence of gate sizes for the combinatorial circuit path from the gate types, effort level, encoder outputs, and predicted gate sizes.

* * * * *